(12) United States Patent
Lin et al.

(10) Patent No.: US 11,881,541 B2
(45) Date of Patent: *Jan. 23, 2024

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/857,052

(22) Filed: Jul. 4, 2022

(65) Prior Publication Data

US 2022/0336702 A1    Oct. 20, 2022

Related U.S. Application Data

(63) Continuation of application No. 16/988,723, filed on Aug. 10, 2020, now Pat. No. 11,404,605.

(30) Foreign Application Priority Data

Sep. 3, 2019    (CN) .......................... 201910828183.9

(51) Int. Cl.
*H01L 33/24*    (2010.01)
*H01L 33/58*    (2010.01)
*H01L 33/50*    (2010.01)

(52) U.S. Cl.
CPC ............ *H01L 33/24* (2013.01); *H01L 33/505* (2013.01); *H01L 33/58* (2013.01)

(58) Field of Classification Search
CPC ........ H01L 33/24; H01L 33/505; H01L 33/58
See application file for complete search history.

(56) References Cited

U.S. PATENT DOCUMENTS

| | | | | |
|---|---|---|---|---|
| 11,404,605 | B2* | 8/2022 | Lin ......................... | H01L 33/58 |
| 2014/0284563 | A1* | 9/2014 | Baek ...................... | H10K 59/38 |
| | | | | 257/40 |
| 2019/0157362 | A1* | 5/2019 | Rho ...................... | H10K 50/822 |
| 2020/0194711 | A1* | 6/2020 | Kim ....................... | H10K 59/35 |
| 2020/0381499 | A1* | 12/2020 | Takahashi ............ | H10K 59/131 |

* cited by examiner

*Primary Examiner* — Mark W Tornow
(74) *Attorney, Agent, or Firm* — Winston Hsu

(57) ABSTRACT

The disclosure provides a display device. The display device includes a substrate, a transistor, an insulating layer, a light blocking layer, a light emitting element, and a light conversion element. The transistor is disposed on the substrate. The insulating layer is disposed on the substrate. The insulating layer includes at least one opening. The light blocking layer is disposed on a top surface of the insulating layer and at least partially overlapped with the transistor. The light emitting element is disposed in the at least one opening, and the light emitting element includes an electrode electrically connected to the transistor. The light conversion element is disposed on the light emitting element.

14 Claims, 14 Drawing Sheets

DISPLAY DEVICE

CROSS REFERENCE TO RELATED APPLICATIONS

This application is a continuation application of U.S. application Ser. No. 16/988,723, filed on Aug. 10, 2020. The content of the application is incorporated herein by reference.

BACKGROUND OF THE DISCLOSURE

1. Field of the Disclosure

The present disclosure relates to a display device.

2. Description of the Prior Art

Quantum dots can convert excitation light emitted by a light emitting element into the converted light of desired color, and the converted light of different colors can be generated through adjusting sizes of the quantum dots. Therefore, in order to increase color saturation of display devices to improve image quality, manufacturers in the related fields propose a scheme of applying quantum dot materials to the display devices. However, the converted light generated by the quantum dots doesn't have directivity, so in the conventional display device, leakage or loss of converted light laterally emitted easily occurs, and the light emitting element as a light source also has some shortcomings. Accordingly, all quantum dots cannot be fully utilized, resulting in poor luminous efficiency of the display device.

SUMMARY OF THE DISCLOSURE

According to an embodiment of the present disclosure, a display device is disclosed and includes a substrate, a transistor, an insulating layer, a light blocking layer, a first light emitting element, and a light conversion element. The transistor is disposed on the substrate. The insulating layer is disposed on the substrate, wherein the insulating layer includes at least one opening. The light blocking layer is disposed on a top surface of the insulating layer and at least partially overlapped with the transistor. The first light emitting element is disposed in the at least one opening, wherein the first light emitting element includes an electrode electrically connected to the transistor. The light conversion element is disposed on the first light emitting element.

According to an embodiment of the present disclosure, a display device is disclosed and includes a substrate, a transistor, an insulating layer, alight blocking layer, alight emitting element, and a color filter layer. The transistor is disposed on the substrate. The insulating layer is disposed on the substrate, wherein the insulating layer includes at least one opening. The light blocking layer is disposed on a top surface of the insulating layer and at least partially overlapped with the transistor. The light emitting element is disposed in the at least one opening, wherein the light emitting element includes an electrode electrically connected to the transistor. The color filter layer is disposed on the light emitting element.

These and other objectives of the present disclosure will no doubt become obvious to those of ordinary skill in the art after reading the following detailed description of the embodiment that is illustrated in the various figures and drawings.

DETAILED DESCRIPTION

Figure 1:
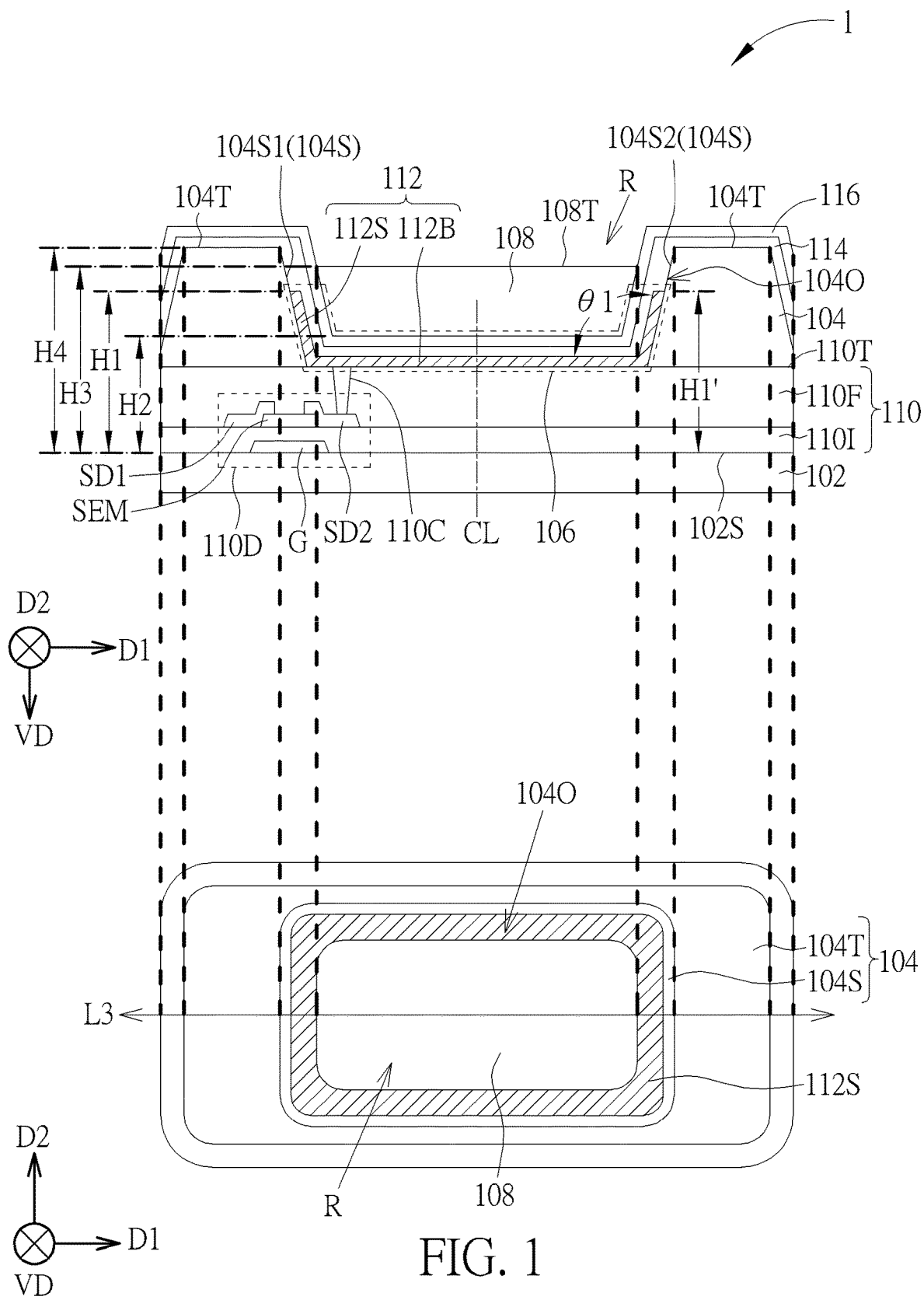
FIG. 1 schematically illustrates a cross-sectional view and a corresponding top view of a display device according to a first embodiment of the present disclosure.

The present disclosure may be understood by reference to the following detailed description, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are just illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to . . . ".

The direction terms used in the following embodiment such as up, down, left, right, in front of or behind are just the directions referring to the attached figures. Thus, the direction terms used in the present disclosure are for illustration, and are not intended to limit the scope of the present disclosure. It should be noted that the elements which are specifically described or labeled may exist in various forms for those skilled in the art. Besides, when a layer is referred to as being "on" another layer or substrate, it may be directly on the other layer or substrate, or may be on the other layer or substrate, or intervening layers may be included between other layers or substrates.

Besides, relative terms such as "lower" or "bottom", and "higher" or "top" may be used in embodiments to describe the relative relation of an element to another element labeled in figures. It should be understood that if the labeled device is flipped upside down, the element in the "lower" side may be the element in the "higher" side.

The ordinal numbers such as "first", "second", etc. are used in the specification and claims to modify the elements in the claims. It does not mean that the required element has any previous ordinal number, and it does not represent the order of a required element and another required element or the order in the manufacturing method. The ordinal number is just used to distinguish the required element with a certain name and another required element with the same certain name.

It should be noted that the technical features in different embodiments described in the following may be replaced, recombined, or mixed with one another to constitute another embodiment without departing from the spirit of the present disclosure.

The display device of the present disclosure may be an electronic device including a light emitting device, a sensing device or a tiled device, but not limited thereto. The display device may include a foldable display device or flexible display device. The tiled device may for example be a tiled display device, but not limited thereto. It is noted that the display device may be any combination of the above, but not limited thereto. The display device may be applied to electronic products or electronic devices that requires light source, light-emitting apparatus or display apparatus, for example but not limited to, television, tablet, notebook, mobile phone, camera, wearable device, electronic entertainment device, etc.

FIG. 1 schematically illustrates a cross-sectional view and a corresponding top view of a display device according to a first embodiment of the present disclosure, wherein an upper portion of FIG. 1 schematically depicts the cross-sectional view of the display device, and a lower portion of FIG. 1 schematically depicts the top view of the display device. For clearly illustrating the display device 1 of the present embodiment, the display device 1 in the upper portion of FIG. 1 omits layers disposed on the light conversion element, and the corresponding lower portion exemplifies a relative relationship between the first insulating layer 104 and the first electrode 112 of the light emitting element 106 of the display device 1 in a top view direction VD, but the present disclosure is not limited thereto. As shown in FIG. 1, the display device 1 includes a substrate 102, a first insulating layer 104, a light emitting element 106, and a light conversion element 108. In the present disclosure, the light emitting element 106 is used for generating excitation light and emitting the excitation light to the light conversion element 108, such that the light conversion element 108 may absorb the excitation light and convert the excitation light into converted light with a wavelength greater than a wavelength of the excitation light. The excitation light may for example be blue light or ultraviolet (UV), and the converted light may for example be red light, green light or blue light, but the present disclosure is not limited thereto. In the present embodiment, one light conversion element 108 may correspond to one light emitting element 106, but not limited thereto. The term "corresponding to" used herein represents the one light conversion element 108 at least partially overlap the one light emitting element 106 in the top view direction VD. In some embodiments, one light conversion element 108 may correspond to a plurality of the light emitting elements 106. In some embodiments, the display device 1 may include a plurality of light emitting elements 106 and a plurality of light conversion element 108 for generating converted light of different colors.

The substrate 102 may be used for carrying the first insulating layer 104, the light emitting element 106, the light conversion element 108 or other layers. The substrate 102 may be a rigid substrate or a flexible substrate. The material of the substrate 102 may for example include glass, quartz, sapphire, polyimide (PI), polycarbonate (PC), polyethylene terephthalate (PET), or combinations thereof, but not limited thereto. In the present embodiment, the display device 1 may further include a thin film transistor layer 110 disposed between the first insulating layer 104 and the substrate 102 and used for controlling a switch of the light emitting element 106 or a brightness of the generated excitation light. For example, the thin film transistor layer 110 may include at least one driving element 110D and at least one switching element (not shown), and the light emitting element 106 may be controlled by the at least one driving element 110D and the at least one switching element, but not limited thereto. The position of the driving element 110D is not limited as shown in FIG. 1, and in some embodiments, the driving element 110D may for example be disposed under the light emitting element 106. In some embodiments, the thin film transistor layer 110 may further include lines for controlling the display device 1, such as scan lines, data lines or other driving circuits, but not limited thereto. The driving element 110D shown in FIG. 1 takes bottom-gate type thin film transistor as an example, wherein the driving element 110D may include a gate G, a semiconductor layer SEM, a source (drain) SD1, and a drain (source) SD2. The gate G is disposed between the semiconductor layer SEM and the substrate 102, and the source (drain) SD1 and the drain (source) SD2 are disposed on two sides of the semiconductor layer SEM respectively. The thin film transistor layer 110 may further include an insulating layer 1101 regarded as a gate insulating layer of the driving element 110D. The structure of transistor of the thin film transistor layer 110 is not limited to the mentioned above and may be a top-gate type transistor or be a dual-gate type transistor or other suitable transistors depending on the requirements. Or, the structure of the transistor of the thin film transistor layer 110 may for example be low-temperature polysilicon (LTPS) transistor, or low-temperature polycrystalline oxide (LTPO) complex transistor, but not limited thereto.

The first insulating layer 104 is disposed on the substrate 102 and includes at least one opening 1040, a top surface 104T, and a side surface 104S, wherein the side surface 104S surrounds the at least one opening 1040, and the top surface 104T is adjacent to the side surface 104S. When the top surface 104T is arc-shaped, method for distinguishing the top surface 104T from the side surface 104S may refer to the description corresponding to FIG. 14. The first insulating layer 104 may for example be a pixel defining layer, and in a cross-sectional view, the first insulating layer 104 may exhibit at least one bump shape and be used for defining a pixel or sub-pixel of the display device 1. For example, the opening 1040 of the first insulating layer 104 may correspond to one pixel or sub-pixel, such that light emitted from the opening 104O in a direction opposite to the top view direction VD may be regarded as light of the pixel or sub-pixel, but not limited thereto. The first insulating layer 104 may include organic material, such as polyimide, but not limited thereto. In the present embodiment, the opening 104O of the first insulating layer 104 and the thin film transistor layer 110 may form a recess R. For example, the thin film transistor layer 110 may include a planarization layer 110F disposed on the driving element 110D, and the first insulating layer 104 may be directly formed on the planarization layer 110F, such that the first insulating layer 104 and the planarization layer 110F may form the recess R. The planarization layer 110F may be an insulating layer, and the material of the planarization layer 110F may for example include organic material, but not limited thereto. Furthermore, the planarization layer 110F may be used for electrically insulating the driving element 110D from the light emitting element 106, and the thin film transistor layer 110 may further include a connecting hole 110C penetrating through the planarization layer 110F or other insulating layers on the driving element 110D, such that conductive material disposed in the connecting hole 110C may electrically connect the driving element 110D to the light emitting element 106.

The light emitting element 106 may be at least disposed in the opening 104O, and the light emitting element 106 includes a first electrode 112, a light emitting layer 114 disposed on the first electrode 112, and a second electrode 116 disposed on the light emitting layer 114. Furthermore, the inside of the light emitting element 106 may include an electron injection layer (EIL), an electron transport layer (ETL), a charge generation layer (CGL), a hole injection layer (HIL), and a hole transport layer (HTL), and in order to clearly illustrate the light emitting element 106, FIG. 1 omits these layers, but not limited thereto. In one embodiment, the first electrode 112 may be partially disposed in the connecting hole 110C to be electrically connected to the drain (source) SD2 of the driving element 110D.

In the present embodiment, the first electrode 112 and the second electrode 116 may be an anode and a cathode respectively, but not limited thereto, and they may be exchanged. It is noted that since the part where the first electrode 112, the light emitting layer 114 and the second electrode 116 are in contact may generate excitation light, the size of the light emitting element 106 may be defined as the area where the light emitting layer 114 contacts both the first electrode 112 and the second electrode 116. The light emitting layer 114 and the second electrode 116 are sequentially at least disposed on the first electrode 112, so a region of the light emitting element 106 that can generate excitation light may substantially correspond to the size of one first electrode 112, but not limited thereto. If the light emitting layer 114 and the second electrode 116 extend or be widened to cover a plurality of the first electrodes 112, the region where can generate excitation light still be the region of the light emitting layer 114 that both contacts the first electrodes 112 and the second electrode 116, and the region for generating excitation light may substantially correspond to a sum of the areas of the plural first electrodes 112. In some embodiments, the light emitting layer 114 and the second electrode 116 covering the plural first electrodes 112 may include discontinuous blocks respectively corresponding to the plural first electrodes 112.

Because the first electrode 112 is formed after the first insulating layer 104 is formed, the first electrode 112 may include a side portion 112S located on the side surface 104S of the first insulating layer 104, and a bottom portion 112B not disposed on the side surface 104S. In other words, the bottom portion 112B of the first electrode 112 is disposed on the bottom of the recess R. In the present embodiment, the first electrode 112 extends along the side surface 104S of the opening 104O and the bottom of the recess R, and is a non-flat shape structure, such as a concave cup shape in a cross-sectional view, but is not limited thereto. For this reason, the light emitting element 106 formed by the first electrode 112, and the light emitting layer 114 and the second electrode 116 covering the first electrode 112 may have an non-flat shape, for example a concave cup shape in a cross-sectional view.

It is noted that in the method of forming the conventional light emitting element, the first insulating layer 104 is firstly formed on the thin film transistor layer 110, and then the first electrode 112 is formed. However, in the present embodiment, since the light emitting element 106 may have the non-flat shape, the light emitting element 106 may include larger light emitting area or reflective area as compared to the conventional light emitting element, but not limited thereto. Accordingly, the intensity of the excitation light generated by the light emitting element 106 may be increased or the utility of light after being reflected may be improved. Or, the converted light generated by the light conversion element 108 may be reflected.

In other embodiments, the side portion 112S of the first electrode 112 may further extend to the top surface 104T of the first insulating layer 104, so that problems of the uneven edge, deckle edge, ragged edge, or suspended edge of the side portion, uneven thickness of the side portion, or inconsistency of the positions of the edges of different side portions resulted from processes (such as etching process) may be improved.

In some embodiments, heights H1, H1' of the side portions 112S of the first electrode 112 disposed on the side surface 104S of the first insulating layer 104 may be the same or different, for example the heights H1, H1' of the side portions 112S on a side surface part 104S1 and another side surface part 104S2 may be the same or different. As the central line CL of the opening 104O is regarded as a symmetry axis, a cross-sectional view of the first electrode 112 taken along the first direction D1 may include a symmetric structure or asymmetric structure, but not limited thereto. The "height" comparison mentioned in this disclosure is relative to the same level, and drawings illustrate the heights are for example relative to the top surface 102S of the substrate 102 that is flattened, wherein when the substrate 102 is the flexible substrate, the comparison mentioned above is relative to the top surface 102S of the substrate 102 that is spread to be flat, but not limited thereto. In some embodiments, the cross-sectional view of the first electrode 112 taken along the second direction D2 may include symmetric structure or asymmetric structure with respect to the central line CL, but not limited thereto. In some embodiments, a partial cross-sectional view of the first electrode 112 taken along the first direction D1 and a partial cross-sectional view of the first electrode 112 taken along the second direction D2 may be symmetric or asymmetric to each other, but not limited thereto. The first direction D1 and the second direction D2 may be different, for example be perpendicular to each other, but not limited thereto. In addition, the position of the central line CL may be obtained for example by obtaining a cross-sectional view of the display device 1 along a direction, then finding the bottom portion 112B of the first electrode 112 from the cross-sectional view and taking the intermediate position between two ends of the bottom portion 112B close to the first insulating layer 104 (e.g. boundary between the side surface part 104S1 of the first insulating layer 104 and the thin film transistor layer 110 and boundary between the side surface part 104S2 of the first insulating layer 104 and the thin film transistor layer 110) as the central line CL, but not limited thereto. In some embodiments, the cross-sectional view of the display device 1 for finding the position of the central line CL may be taken along a cross-sectional line passing through at least a part of the driving element 110D. In some embodiments, the cross-sectional direction of the cross-sectional view mentioned above may for example be the cross-section line L3 along the first direction D1 shown in FIG. 1. The cross-sectional line L3 may pass through both side surfaces 104S of the first insulating layer 104, or may pass through at least a part of the driving element 110D (e.g. source (drain) SD1/drain (source) SD2), or pass through the connecting hole 110C, but not limited thereto.

In some embodiments, an angle θ1 between the side portion 112S and the bottom portion 112B of the first electrode 112 may for example be greater than or equal to 90 degrees and less than or equal to 150 degrees (90≤θ1≤150). The angle θ1 may for example determined by adjusting an angle between the side surface 104S of the first insulating layer 104 and the top surface 110T of the thin film transistor layer 110, but not limited thereto. In some embodiments, the angle θ1 may be determined by the side portion 112S and the bottom portion 112B of the first electrode 112 or by the first insulating layer 104 and the thin film transistor layer 110. When the top surface 104T or the side surface 104S of the first insulating layer 104 is an uneven surface, the calculating method of the angle θ1 may refer to the description corresponding to FIG. 14. Also, angles θ1 between the bottom portion 112B and different parts of the side portion 112S of the first electrode 112 (e.g. parts of the side portion 112S located on two sides of the bottom portion 112B) may be different, and through adjusting the difference of the angles θ1, the coupling capacitance between the first electrode 112 and different elements in the underlying thin film transistor layer 110 (e.g. storage capacitance between the first electrode 112 and the common line (not shown) under the first electrode 112), angle of reflecting the excitation light or the converted light, or the light emitting angle of the light emitting element 106 may be altered.

The first electrode 112 may include conductive material having reflective characteristics, such as silver (Ag), magnesium (Mg), aluminum (Al), platinum (Pt), palladium (Pd), gold (Au), nickel (Ni), neodymium (Nd), iridium (Ir), chromium (Cr), other suitable metal, or combinations of above metals. The second electrode 116 may include transparent or translucent conductive material, such as silver (Ag), aluminum (Al), ytterbium (Yb), titanium (Ti), magnesium (Mg), nickel (Ni), lithium (Li), calcium (Ca), copper (Cu), lithium fluorine/gallium (LiF/Ga), lithium fluorine/aluminum (LiF/Al), magnesium silver (MgAg), calcium silver (CaAg), nano silver glue, other suitable conductive material, or any combination of above conductive materials. Since the second electrode 116 has a thickness of for example several nanometers up to several ten nanometers, the second electrode 116 may allow light to penetrate.

In some embodiments, the light emitting layer 114 of the light emitting element 106 may include a single layer or multiple layers, and is not limited thereto. In some embodiments, the light emitting element 106 may further include the hole transport layer, the hole injection layer, the electron transport layer, the electron injection layer, and the charge generation layer covering the first electrode 112, but not limited thereto. When the first electrode 112 is the anode, and the second electrode 116 is the cathode, the hole transport layer and the hole injection layer are disposed between the first electrode 112 and the light emitting layer 114, and the electron transport layer and the electron injection layer are disposed between the second electrode 116 and the light emitting layer 114. When the light emitting element 106 includes a plurality of light emitting layers 114, the charge generation layer may be disposed between two light emitting layers 114, but not limited thereto.

The light conversion element 108 is disposed on the light emitting element 106. The light conversion element 108 may for example include phosphor material, fluorescent material, quantum dot particles or other light converting material that is capable of converting color of light, and the light converting materials mentioned above may be arbitrarily combined, but not limited thereto. Specifically, the light conversion element 108 may at least fill into the recess R, such that the height H1 of the side portion 112S of the first electrode 112 may be greater than the height H2 of the bottom of the light conversion element 108. Thus, both the side portion 112S and the bottom portion 112B of the first electrode 112 may reflect the converted light generated by the light conversion element 108, thereby reducing leakage or loss of the converted light due to being emitted from the side surface 104S of the first insulating layer 104 or improving light utility of the light conversion element 108. Furthermore, by the design of the side portion 112S of the first electrode 112, the excitation light generated by the light emitting element 106 corresponding to the side portion 112S may enter the light conversion element 108 from the side surface of the light conversion element 108, thereby increasing light emitting area. Accordingly, the light conversion particles in the light conversion element 108 may be fully utilized, or the converting efficiency of the light conversion element 108 may be increased. For example, in order to have enough light conversion particles, the thickness of the light conversion element 108 may range from about 6 microns (μm) to 8 microns. When the height H1 and the height H1' are different, a higher one of the height H1 and the height H1' may be taken as the height H1 to be compared with the height H2.

In some embodiments, the height H3 of the top surface 108T of the light conversion element 108 may be greater than the height H1 of the side portion 112S of the first electrode 112, such that all the excitation light generated by the light emitting element 106 may be emitted into the light conversion element 108. In this disclosure, the height H1 of the side portion 112S of the first electrode 112, the height H2 of the bottom of the light conversion element 108, the height H3 of the top surface 108T of the light conversion element 108, and the height H4 of the top surface 104T of the first insulating layer 104 may be defined as starting from the same level, for example starting from the top surface 102S of the substrate 102, but not limited thereto. When the top surface 108T of the light conversion element 108 is arc-shaped, the height H3 may be taken as the distance from bottom of the top surface 108S of the light conversion element 108 closest to the substrate 102 to the top surface 102S of the substrate 102. In some embodiments, in order to avoid the light conversion element 108 flowing over the recess R during forming the light conversion element 108, the height H3 of the top surface 108T of the light conversion element 108 may be less than the height H4 of the top surface 104T of the first insulating layer 104.

The display device of the present disclosure is not limited to the above-mentioned embodiments and may include different embodiments or variant embodiments. In order to simplify the description, the elements of different embodiments and variant embodiments and the same element of the first embodiment will use the same label. In order to compare the difference between the first embodiment and different embodiments and variant embodiments, the following contents would focus on the difference between different embodiments or variant embodiments, and the repeated portion will not be redundantly described.

Figure 2:
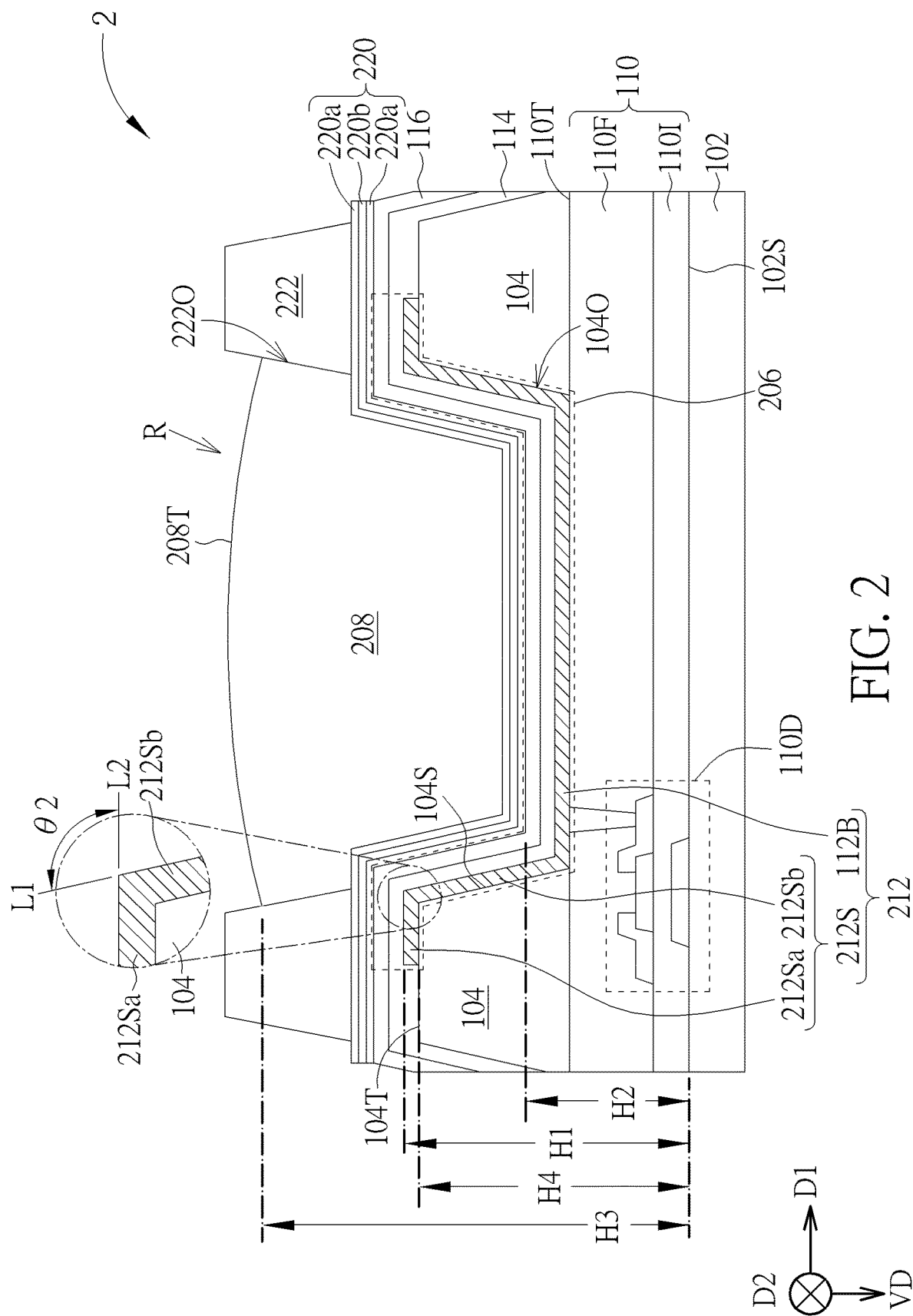
FIG. 2 schematically illustrates a cross-sectional view of a display device according to a second embodiment of the present disclosure.

FIG. 2 schematically illustrates a cross-sectional view of a display device according to a second embodiment of the present disclosure. As shown in FIG. 2, the difference between the display device 2 of the present embodiment and the first embodiment shown in FIG. 1 is that the display device 2 may further optionally include a protection layer 220 disposed between the light emitting element 206 and the light conversion element 208. In detail, the protection layer 220 may include a stack of an inorganic material layer 220a, an organic material layer 220b, and an inorganic material layer 220a to reduce moisture or oxygen from penetration. Besides, the protection layer 220 may also prevent the light emitting element 206 from being damaged by the filling process of the light conversion element 208. For example, the inorganic material layer may include silicon nitride, silicon oxygen, silicon oxynitride, aluminum oxide, other suitable protecting material, or any combination of the inorganic materials mentioned above, but not limited thereto. The organic material layer may include resin, but not limited thereto. In some embodiments, the protection layer 220 may be single inorganic material layer 220a or a stack of plural inorganic material layers. In some embodiments, another protection layer may be disposed on the light conversion element 208 to protect the light conversion element 208.

In some embodiments, the side portion 212S of the first electrode 212 may further extend to the top surface 104T of the first insulating layer 104, so that problems of the uneven edge, deckle edge, ragged edge, or suspended edge of the side portion, uneven thickness of the side portion, or inconsistency of the positions of the edges of different side portions resulted from processes (such as etching process) may be improved. Furthermore, the side portion 212S may include a part 212Sa extending to the top surface 104T and another part 212Sb not extending to the top surface 104T. For example, an angle θ2 between the part 212Sa and the part 212Sb may be greater than or equal to 190 degrees and less than or equal to 275 degrees (190≤θ2≤275), such that the first electrode 212 may be tightly adhered on the first insulating layer 104, and peeling of the first electrode 212 from the first insulating layer 104 may be reduced. The angle θ2 may be located between a virtual line L1 extending from the top surface of the part 212Sb of the side portion 212S and a virtual line L2 extending from the top surface of the part 212Sa of the side portion 212S. When the top surface 104T or the side surface 104S of the first insulating layer 104 is uneven, the definitions of the top surface 104T and the side surface 104S and the calculating method of the angle θ2 may refer to the description corresponding to FIG. 14.

In this embodiment, the display device 2 may further include a light blocking layer 222 disposed on the protection layer 220, and the light blocking layer 222 has an opening 2220 corresponding to the opening 1040 of the first insulating layer 104. The opening 2220 corresponding to the opening 1040 means that in the top view direction VD, the projection region of the bottom of the opening 2220 and the projection region of the bottom of the opening 1040 at least partially or completely overlap. In other words, the light blocking layer 222 is disposed on the top surface 104T of the first insulating layer 104. The light blocking layer 222 may shield light reflected by the part 212Sa of the first electrode 212 extending to the top surface 104T of the first insulating layer 104 and also shield the excitation light generated by the light emitting element 206 corresponding to the part 212Sa, thereby avoiding mixing light. Furthermore, by means of the disposition of the light blocking layer 222, the height H3 of the top surface 208T of the light conversion element 208 may be greater than the height H4 of the top surface 104T of the first insulating layer 104, and the light conversion element 208 will not overflow into other openings 1040. In some embodiments, the top surface 208T of the light conversion element 208 may be convex, but not limited thereto. In a cross-sectional view of one embodiment, two sides of the top surface 208T of the light conversion element 208 that contact the light blocking layer 222 may have different heights, and the height H3 is the lower one of the different heights. In a cross-sectional view of one embodiment, the top surface 104T of the first insulating layer 104 may have different heights, and the height H4 is the higher one of the different heights.

Figure 3:
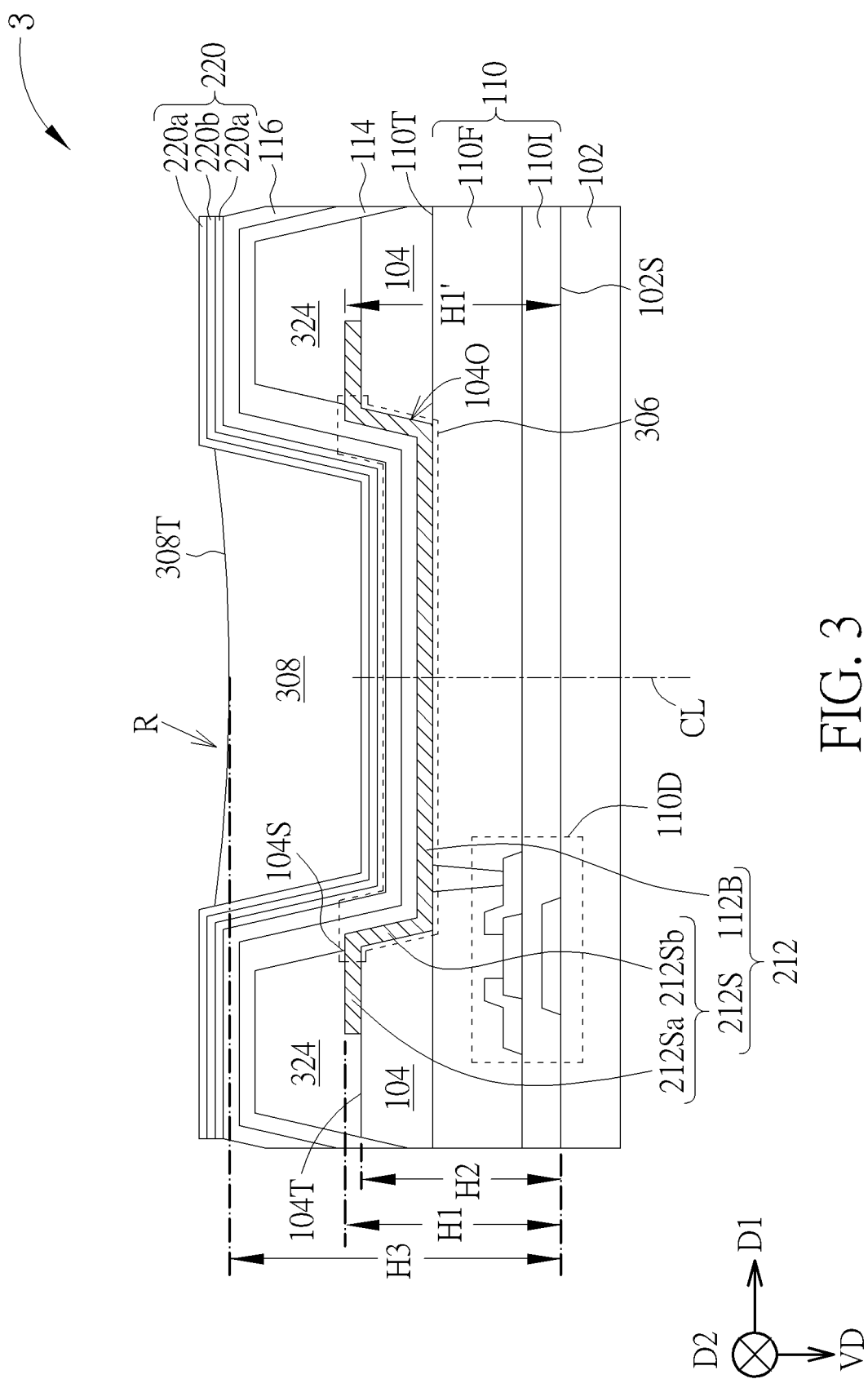
FIG. 3 schematically illustrates a cross-sectional view of a display device according to a third embodiment of the present disclosure.

FIG. 3 schematically illustrates a cross-sectional view of a display device according to a third embodiment of the present disclosure. As shown in FIG. 3, the difference between the display device 3 of the present embodiment and the second embodiment shown in FIG. 2 is that the display device 3 may further optionally include a second insulating layer 324 disposed on the first insulating layer 104, such that the part 212Sa of the side portion 212S of the first electrode 212 is disposed between the first insulating layer 104 and the second insulating layer 324. Specifically, the second insulating layer 324 may be disposed between the first insulating layer 104 and the light emitting layer 114, such that the part of the light emitting layer 114 located on the second insulating layer 324 may be separated from the part 212Sa of the first electrode 212, and the part of the light emitting layer 114 on the second insulating layer 324 will not generate light. Accordingly, the light emitting element 306 of the present embodiment may be formed of the part 212Sb of the first electrode 212 contacting the light emitting layer 114, the part of the light emitting layer 114 contacting the first electrode 212 and the part of the second electrode 116 contacting the part of the light emitting layer 114. The angle between the part 212Sa and the part 212Sb (as the angle θ2 shown in FIG. 2) may be greater than or equal to 190 degrees and less than or equal to 275 degrees. In some embodiments, the second insulating layer 324 may include light blocking material for shielding the excitation light generated by the light emitting element 306 from laterally emitting out, thereby reducing light mixing. Accordingly, the display device 3 may not require the light blocking layer. In some embodiments, the second insulating layer 324 may be multilayer structure, so that the height of the top surface of the second insulating layer 324 may be increased to prevent the light conversion element 308 from overflowing in the situation that no light blocking layer is required. In some embodiments, the top surface 308T of the light conversion element 308 may be concave, but not limited thereto. In some embodiments, the height H1 of the part 212Sa of the side portion 212S of the first electrode 212 may be the same as the height H1' of the part 212Sb of the side portion 212S of the first electrode 212. In such situation, the widths of the part 212Sa and the part 212Sb may optionally be the same, such that the first electrode 212 may include symmetric structure with respect to the central line CL, but not limited thereto. In a cross-sectional view of the embodiment shown in FIG. 3, the height H3 of the top surface 308T of the light conversion element 308 may substantially be the height of the lowest point of the top surface 308T in the cross-sectional view.

Figure 4:
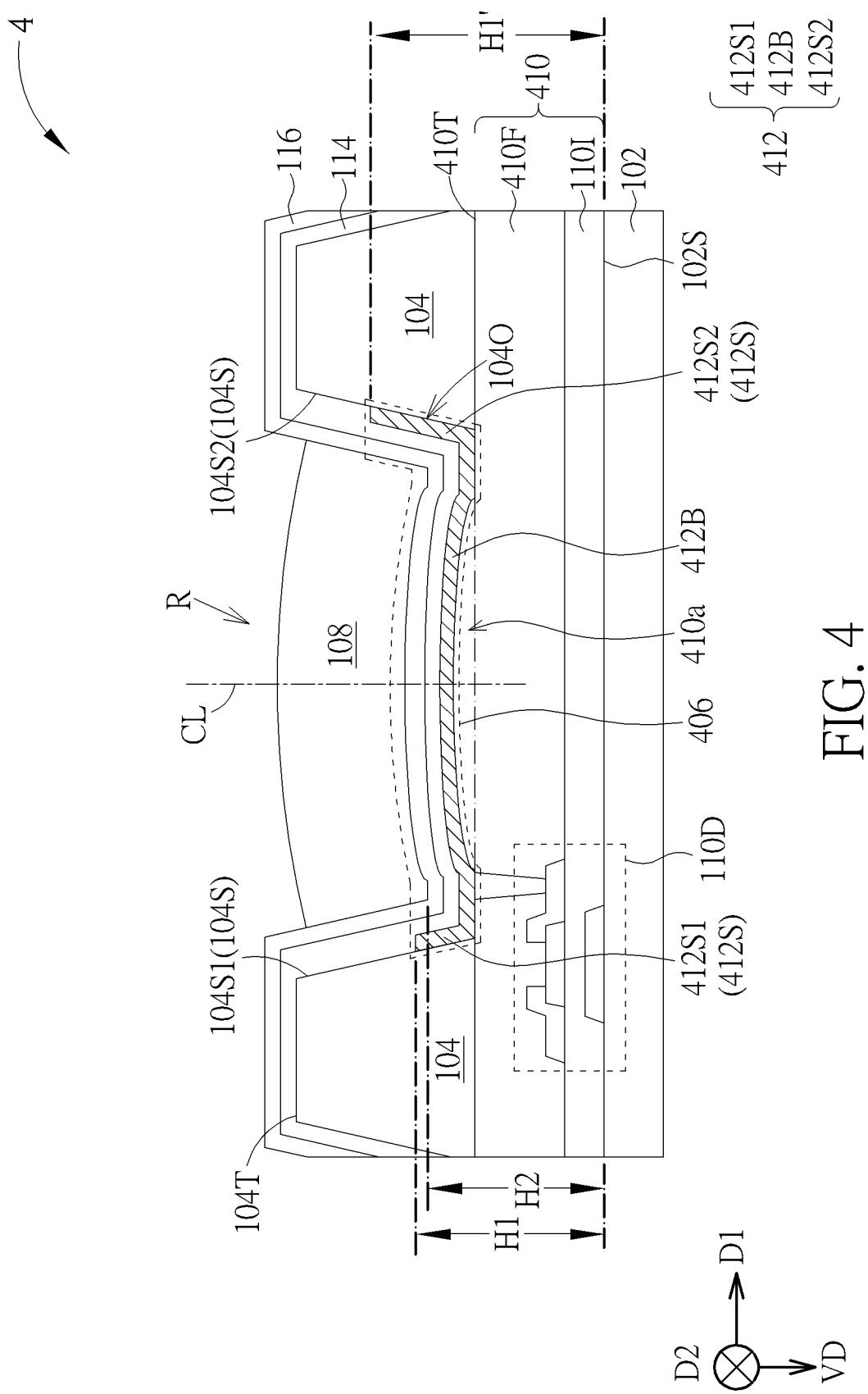
FIG. 4 schematically illustrates a cross-sectional view of a display device according to a fourth embodiment of the present disclosure.

FIG. 4 schematically illustrates a cross-sectional view of a display device according to a fourth embodiment of the present disclosure. As shown in FIG. 4, the difference between the display device 4 of the present embodiment and the first embodiment shown in FIG. 1 is that the thin film transistor layer 410 of the display device 4 may have a protrusion part 410a corresponding to the opening 1040. In other words, the protrusion part 410a is disposed on an extending plane of the flat top surface 410T of the thin film transistor layer 410 (as the virtual line at the bottom of the protrusion part 410a shown in FIG. 4), and the top surface of the protrusion part 410a may form a part of the bottom of the recess R. For example, the protrusion part 410a may be formed for example by utilizing gray-tone mask or half-tone mask when patterning the planarization layer 410F, but not limited thereto. By means of the protrusion part 410a, the area of the bottom portion 412B of the first electrode 412 disposed in the recess R may be increased, thereby raising the intensity of the excitation light generated by the light emitting element 406.

In addition, in some embodiments, the height of the side portion 412S of the first electrode 412 disposed on the side surface 104S of the first insulating layer 104 may not be identical, for example in the situation that the side portion 412S doesn't extend to the top surface 104T of the first insulating layer 104, the height H1 of the part 412S1 of the first electrode 412 (e.g. on the left side of the light conversion element 408) may be less than the height H1' of the part 412S2 of the first electrode 412 (e.g. on the right side of the light conversion element 408), so that the cross-sectional view of the first electrode 112 along the first direction D1 is an asymmetric structure when the central line CL of the opening 1040 is used as the symmetry axis, but not limited thereto.

Figure 5:
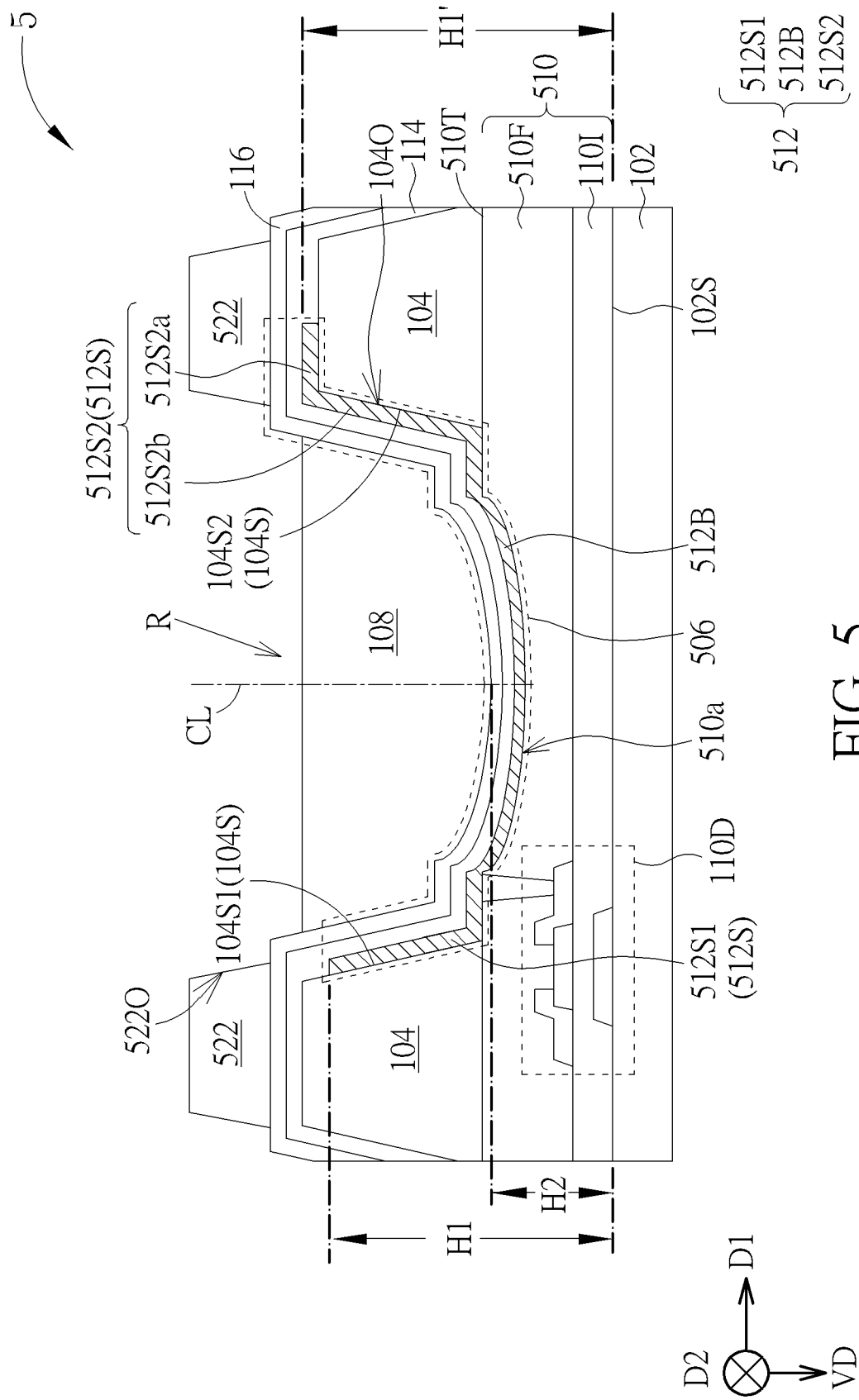
FIG. 5 schematically illustrates a cross-sectional view of a display device according to a fifth embodiment of the present disclosure.

FIG. 5 schematically illustrates a cross-sectional view of a display device according to a fifth embodiment of the present disclosure. As shown in FIG. 5, the difference between the display device 5 of the present embodiment and the fourth embodiment of FIG. 4 is that the thin film transistor layer 510 of the display device 5 may have a recess part 510a corresponding to the opening 1040. The top surface 510T of the recess part 510a may form a part of the bottom of the recess R. For example, the planarization layer 510F of the thin film transistor layer 510 may have the recess part 510a. The recess part 510a may be formed for example by utilizing gray-tone mask or half-tone mask when patterning the planarization layer 510F, but not limited thereto. By means of the recess part 510a, the area of the bottom portion 512B of the first electrode 512 disposed on the top surface 510T of the thin film transistor layer 510 may be increased, thereby raising the intensity of the excitation light generated by the light emitting element 506.

Moreover, in some embodiments, apart of the side portion 512S of the first electrode 512 disposed on the side surface 104S of the first insulating layer 104 may extend to the top surface 104T of the first insulating layer 104. For example, the part 512S2 of the side portion 512S located on the side surface part 104S2 (located on the right side of the light conversion element 108) may extend to the top surface 104T of the first insulating layer 104, so that the part 512S2 may further include a part 512S2a located on the top surface 104T of the first insulating layer 104 and a part 512S2b located on the side surface 104S of the first insulating layer 104. Also, the part 512S1 of the side portion 512S located on the side surface part 104S1 (located on the left side of the light conversion element 108) doesn't extend to the top surface 104T of the first insulating layer 104, so the height H1 of the part 512S1 of the side portion 512S may be less than the height H1' of the part 512S2 of the side portion 512S on the top surface 104T of the first insulating layer 104. Accordingly, the cross-sectional view of the first electrode 512 along the first direction D1 may be asymmetric with respect to the central line CL of the opening 1040, but not limited thereto. In order to shield the excitation light generated by the light emitting element 506 disposed on the top surface 104T of the first insulating layer 104, a light blocking layer 522 may be further disposed on the top surface 104T of the first insulating layer 104. The light blocking layer 522 may have an opening 5220 corresponding to the opening 1040 of the first insulating layer 104. Since the light blocking layer 522 of the present embodiment may be similar to or the same as the light blocking layer of the second embodiment, the light blocking layer 522 will not be redundantly detailed.

Figure 6:
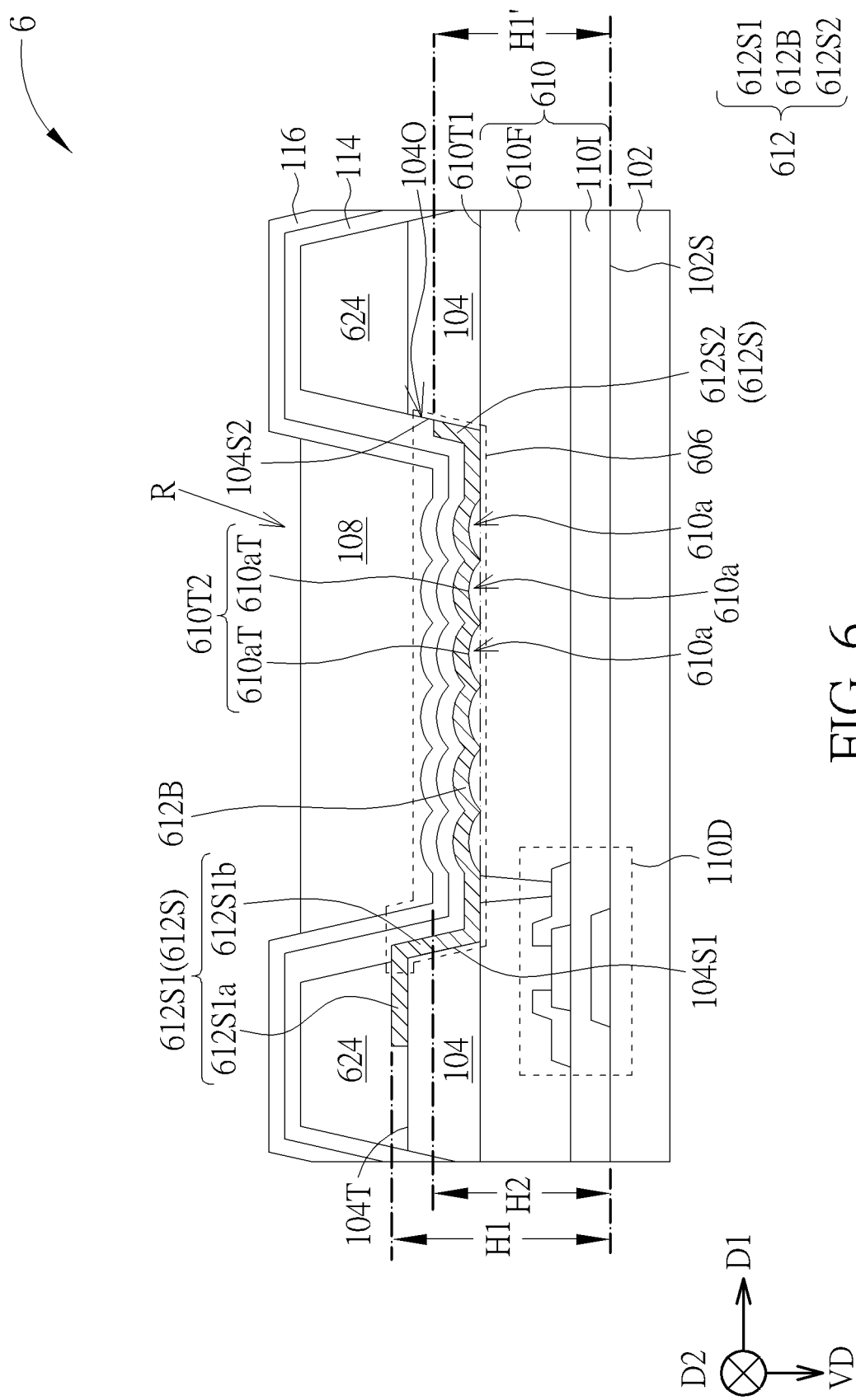
FIG. 6 schematically illustrates a cross-sectional view of a display device according to a sixth embodiment of the present disclosure.

FIG. 6 schematically illustrates a cross-sectional view of a display device according to a sixth embodiment of the present disclosure. As shown in FIG. 6, the difference between the display device 6 of the present embodiment and the embodiment shown in FIG. 4 is that the thin film transistor layer 610 of the display device 6 may have a plurality of protrusion parts 610a corresponding to the opening 1040. In other words, the protrusion parts 610a are disposed on the extending plane of the flat top surface 610T1 of the thin film transistor 610 (as the virtual line located on the bottom of the protrusion parts 610a shown in FIG. 6), and the top surfaces 610aT of the protrusion parts 610a may form a part of the recess R. Specifically, the planarization layer 610F of the thin film transistor layer 610 may include a plurality of protrusion parts 610a, and in the present embodiment, the plural protrusion parts 610a are connected in sequence, such that the top surface 610T2 corresponding to the opening 1040 is formed to be wave-shaped by the top surfaces 610aT of the plural protrusion parts 610a. The protrusion parts 610a may be formed for example by utilizing gray-tone mask or half-tone mask when patterning the planarization layer 610F, but not limited thereto. Through the wave-shaped top surface 610T2, the area of the bottom portion 612B of the first electrode 612 disposed on the top surface 610T2 of the thin film transistor 610 may be increased, thereby increasing the intensity of the excitation light generated by the light emitting element 606. In some embodiments, the thin film transistor layer 610 may include a plurality of recess parts (not shown) sequentially connected, such that the surfaces of the recess parts may be connected and form a wave-shaped top surface. When the thin film transistor layer 610 has the plural protrusion parts 610a or plural recess parts connected in sequence, the height H2 of the bottom of the light conversion element 108 may be taken for example as the lowest point of the light conversion element 108 between two adjacent protrusion parts 610a or the lowest point of one of the recess parts.

In some embodiments, the part 612S1 of the side portion 612S of the first electrode 612 located on the side surface part 104S1 (located on the right side of the light conversion element 106) may extend to the top surface 104T of the first insulating layer 104, so that the part 612S1 may further include a part 612S1a disposed on the top surface 104T of the first insulating layer 104 and a part 612S1b disposed on the side surface 104S1 of the first insulating layer 104. Also, the part 612S2 of the side portion 612S located on the side surface part 104S2 (located on the right side of the light conversion element 106) doesn't extend to the top surface 104T of the first insulating layer 104, and therefore, the height H1 of the part 612S1 of the side portion 612S may be greater than the height H1' of the part 612S2 of the side portion 612S. In some embodiments, the display device 6 may further include a second insulating layer 624 disposed on the top surface 104T of the first insulating layer 104, and the part 612S1a of the side portion 612S extending to the top surface 104T of the first insulating layer 104 is disposed between the first insulating layer 104 and the second insulating layer 624. Since the second insulating layer 624 may be similar to or the same as the second insulating layer of the third embodiment, the second insulating layer 624 will not be redundantly detailed.

Figure 7:
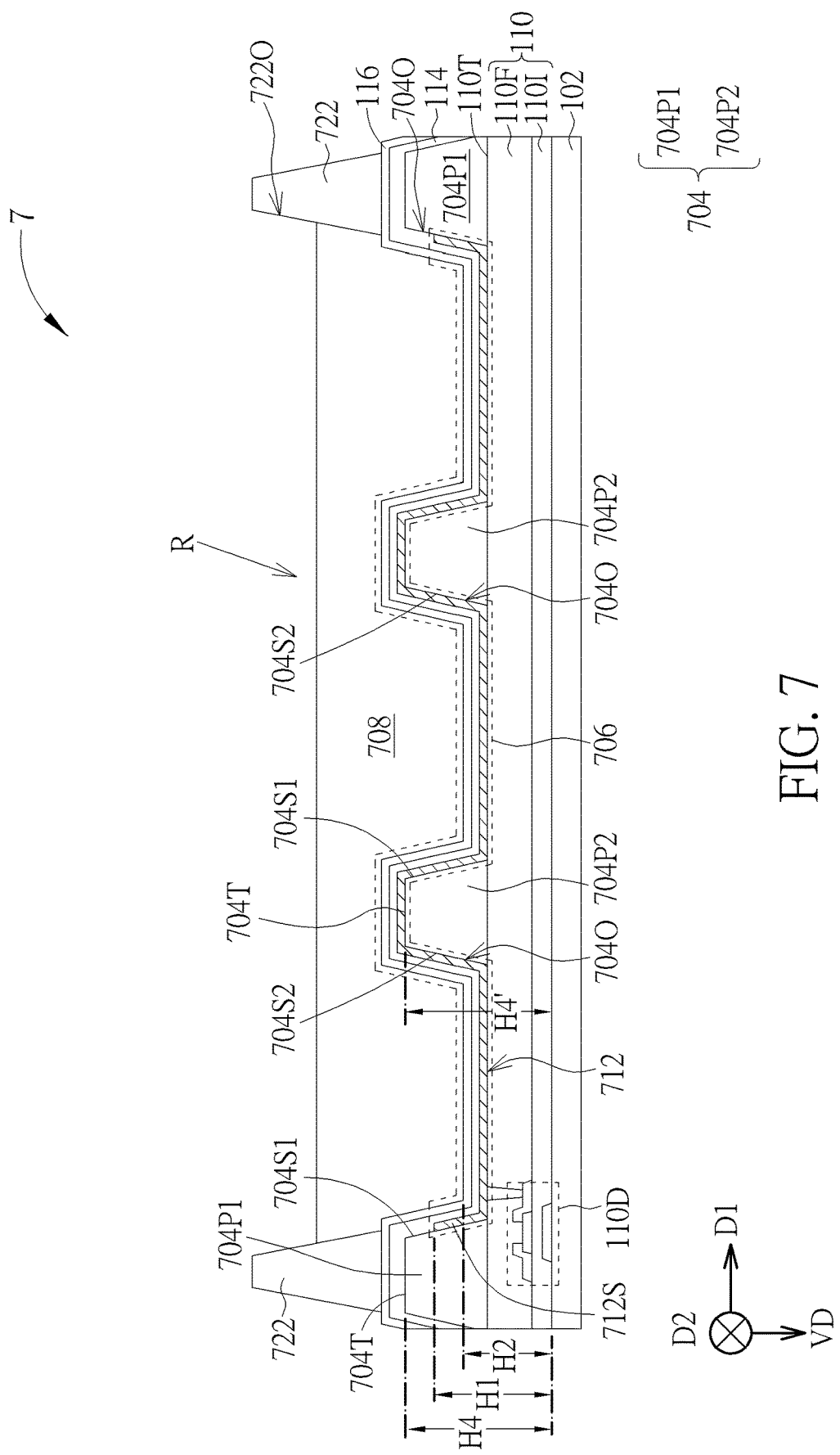
FIG. 7 schematically illustrates a cross-sectional view of a display device according to a seventh embodiment of the present disclosure.

FIG. 7 schematically illustrates a cross-sectional view of a display device according to a seventh embodiment of the present disclosure. As shown in FIG. 7, the difference between the display device 7 of the present embodiment and the second embodiment shown in FIG. 2 is that a first insulating layer 704 may further include a plurality of bumps 704P2, wherein bumps 704P1 (that are similar to the first insulating layer 104 shown in FIG. 2) of the first insulating layer 704 overlap the light blocking layer 722 in the top view direction VD and define pixels or sub-pixels of the display device 7, and the bumps 704P2 doesn't overlap the light blocking layer 722 and are used for increasing the light emitting area of the light emitting element 706. Furthermore, any adjacent two of the bumps 704P1 and bumps 704P2 may have an opening 7040 therebetween, wherein the opening 7040 is surrounded by the side surface 704S1, the side surface 704S2 or/and the side surface of the first insulating layer 704. The opening 7220 of the light blocking layer 722 may correspond to the plural openings 7040 of the first insulating layer 704, and the first electrode 704 may extend into at least two of the openings 7040, but not limited thereto. In other words, the first electrode 712 may cross at least one bump 704P2. More specifically, the first electrode 712 may extend from the side surface 704S2 of the bump 704P2 (i.e. from one of the openings 7040) to another side surface 704S1 (i.e. into another opening 7040) through the top surface 704T of the bump 704P2, thereby increasing the area of the first electrode 712. When the light emitting layer 114 and the second electrode 116 are continuous layers, the light emitting element 706 may cross the plural openings 7040, and therefore, the light emitting area of the light emitting element 706 may be increased to improving the intensity of the excitation light generated by the light emitting element 706.

In the present embodiment, the light conversion element 708 may be disposed in the openings 7040 of the first insulating layer 704 and at least partially be disposed in the opening 7220 of the light blocking layer 722, so as to be disposed on the light emitting element 706. In the present embodiment, one opening 7220 of the light blocking layer 722 may correspond to three openings 7040 of the first insulating layer 704, and the first electrode 712 may cross three openings 7040 and/or cross two bumps 704P2, but not limited thereto. The openings 7040 of the first insulating layer 704, the corresponding opening 7220 of the light blocking layer 722, and the top surface 110T of the thin film transistor layer 110 may form the recess R. In the present embodiment, the height H4' of the bump 704P2 may be the same as the height H4 of the bump 704P1 located under the light blocking layer 722, such that the height of the part of the first electrode 712 on the bump 704P2 may be greater than the height H1 of the side portion 712S of the first electrode 712, but not limited thereto. In some embodiments, the height H4' of the bump 704P2 may be less than the height H4 of the bump 704P1 under the light blocking layer 722.

Figure 8:
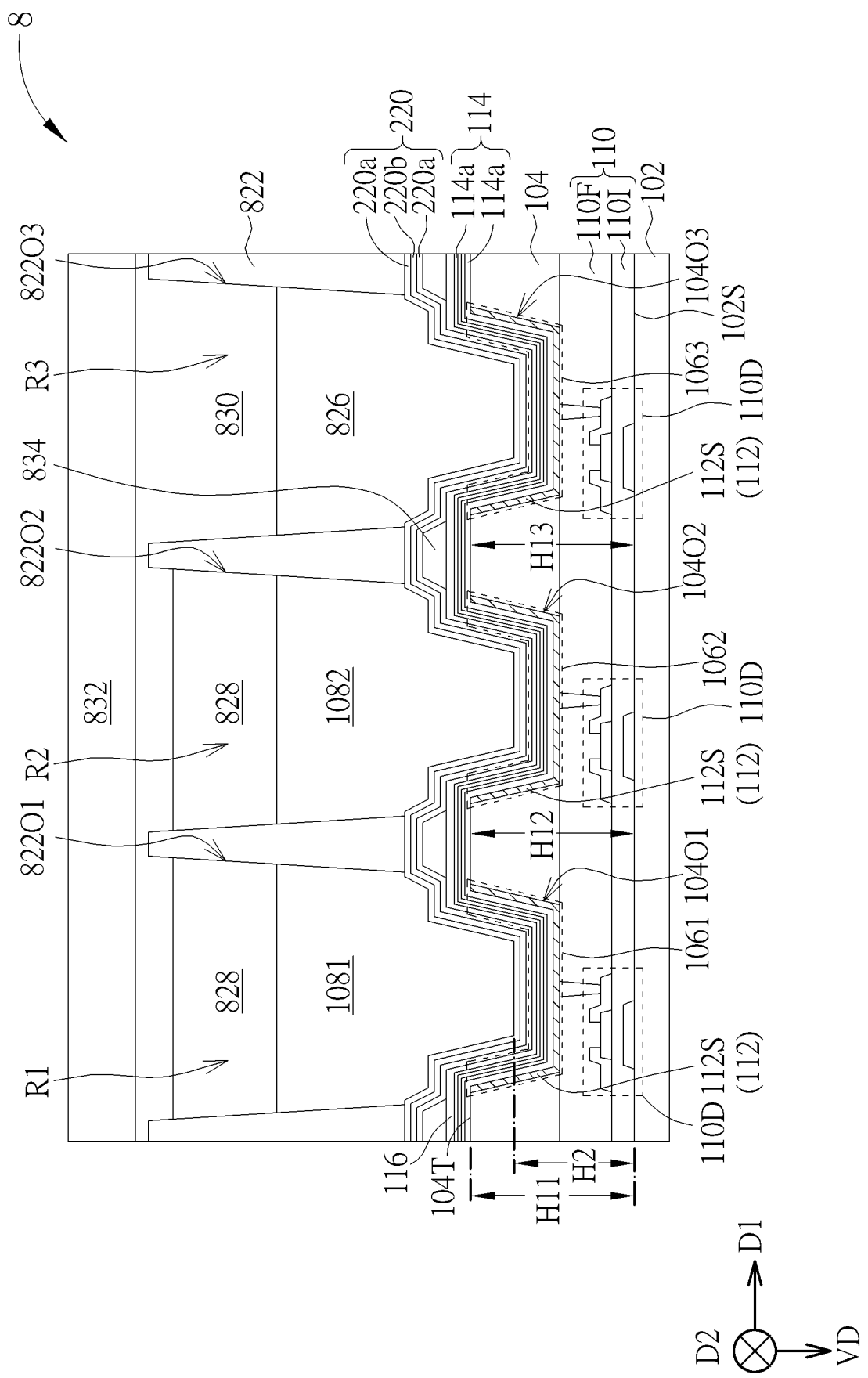
FIG. 8 schematically illustrates a cross-sectional view of a display device according to an eighth embodiment of the present disclosure.

FIG. 8 schematically illustrates a cross-sectional view of a display device according to an eighth embodiment of the present disclosure. As compared to the first embodiment of FIG. 1, FIG. 8 further exemplifies layers on the light conversion elements and regions of the light conversion elements corresponding to different colors. As shown in FIG. 8, the display device 8 of the present embodiment may include at least three light emitting elements (e.g. a light emitting element 1061, a light emitting element 1062, and a light emitting element 1063), the first insulating layer 104 may include openings (e.g. an opening 10401, an opening 10402, and an opening 10403), and the light emitting element 1061, the light emitting element 1062, and the light emitting element 1063 may be at least disposed in the opening 10401, opening 10402, and opening 10403 respectively. In the present embodiment, the light emitting element 1061, the light emitting element 1062 and the light emitting element 1063 may respectively include a first electrode 112, and the first electrodes 112 correspond to the opening 10401, opening 10402, and opening 10403 respectively. The height H11, the height H12, and the height H13 of the side portions 112S of the first electrodes 112 of the light emitting element 1061, the light emitting element 1062, and the light emitting element 1063 may be the same, but not limited thereto. In some embodiments, the height H11, the height H12, and the height H13 of the side portions 112S of different first electrodes 112 may be different or at least two of which are different. In some embodiments, the side portion 112S of at least one of the first electrodes 112 may adopt the side portion of the first electrode of any one embodiment mentioned above.

The light emitting element 1061, the light emitting element 1062, and the light emitting element 1063 of the present embodiment may share the same light emitting layer 114 and the same second electrode 116. In other words, the light emitting layer 114 and the second electrode 116 may be continuous layers and cover the first insulating layer 104 and the first electrode 112, such that the light emitting element 1061, the light emitting element 1062, and the light emitting element 1063 may generate the excitation light with the same color, such as blue light, but the present disclosure is not limited thereto. In some embodiments, the light emitting layer 114 may be a discontinuous layer, such that portions of the light emitting layer 114 corresponding to different light emitting elements may be used to generate different colors respectively. The color generated by the light emitting element 1063 regarded as a color of a sub-pixel is taken for an example in the present embodiment, and the display device 7 may include the light conversion element 1081 and the light conversion element 1082 for generating converted light of different colors, and a light scattering layer 826 disposed on the light emitting element 1063. The light conversion element 1081 and the light conversion element 1082 are disposed on the light emitting element 1061 and the light emitting element 1062 respectively. The light conversion element 1061 and the light conversion element 1062 may convert the excitation light generated by the light emitting element 1061 and the light emitting element 1062 into the converted light of corresponding colors, for example generate the converted light of red and green respectively.

The light scattering layer 826 may for example include a plurality of scattering particles, but not limited thereto. The material of the scattering particle may for example include titanium oxide or a structural particle with scattering characteristics, but not limited thereto. In some embodiments, when the color of the light emitting element 1063 is not used as the color of the sub-pixel (e.g. color of the sub-pixel of image viewed by user), each light emitting element (all the light emitting element 1061, the light emitting element 1062, and the light emitting element 1063) has the light conversion element disposed thereon, and the light conversion elements corresponding to different light emitting elements (the light emitting element 1061, the light emitting element 1062, and the light emitting element 1063) may generate the converted light of different colors. In such situation, the light conversion element may for example generate red light, green light, and blue light, and the light emitting element 1061, the light emitting element 1062, and the light emitting element 1063 may for example generate the excitation light with the wavelength less than the red light, the green light, and the blue light, such as blue light or ultraviolet light, but not limited thereto. In the present embodiment, the light emitting layer 114 may include a plurality of sub-layers 114a, for example the light emitting layer 114 of the present embodiment may include four sub-layers 114a, but not limited thereto. The sub-layers 114a for example include organic light emitting layer, hole transport layer, hole injection layer, electron transport layer, electron injection layer or charge generation layer, but not limited thereto. In some embodiments, the light emitting layer 114 may be a single-layer organic light emitting layer, but not limited thereto.

In the present embodiment, the display device 8 may further include a light blocking layer 822 disposed on the first insulating layer 104, and the light blocking layer 822 may include openings (e.g. an opening 82201, an opening 82202, and an opening 82203) respectively corresponding to the opening 10401, the opening 10402, and the opening 10403, wherein each of the opening 82201, the opening 82202, and the opening 82203 and the corresponding one of the opening 10401, the opening 10402, and the opening 10403 form a part of sidewall of the corresponding one of the recess R1, the recess R2, and recess R3. The light blocking layer 822 may be used as a partition wall for preventing the light conversion element 1081, the light conversion element 1082, and the light scattering layer 826 from overflow. The light blocking layer 822 may be similar to or the same as the light blocking layer of the second embodiment and will not be repeatedly detailed.

The display device 8 of the present embodiment may further optionally include a protection layer 220 disposed between the light emitting element 1061 and the light conversion element 1081, between the light emitting element 1062 and the light conversion element 1082 and between the light emitting element 1063 and the light scattering layer 826 and used for preventing the light emitting element 1061, the light emitting element 1062 and the light emitting element 1063 from damage. The protection layer 220 of the present embodiment may be similar to or the same as the protection layer of the second embodiment and will not be redundantly mentioned.

The display device 8 may further optionally include a light filtering layer 828 that has the characteristics of selecting light with specific wavelength and is disposed on the light conversion element 1081 and the light conversion element 1082, such that the excitation light with the specific wavelength generated by the light emitting element 1061 and the light emitting element 1062 may be blocked, inhibited, reflected, or recycled by the light filtering layer 828, and the excitation light with the specific wavelength is prevented from being emitted out from the opening 82201 and the opening 82202. Accordingly, purity of final output light emitted by the regions corresponding to the light conversion element 1081 and the light conversion element 1082 may be increased (i.e. the color of the final output light may be close to the color of the converted light generated by the corresponding one of the light conversion element 1081 and the light conversion element 1082). The structure of the light filtering layer 828 may be multilayer and be a distributed Bragg reflector (DBR) formed of layers with different refractive indices alternately stacked or a color filter layer (such as a red photoresist, a yellow photoresist, a green photoresist, etc.), but not limited thereto. In the present embodiment, since the color generated by the light emitting element 1063 may be regarded as the color of one sub-pixel (e.g. the color of the sub-pixel of the image viewed by the user), no light filtering layer 828 may be disposed in the opening 82203 of the light blocking layer 822. In some embodiments, when the color of the light emitting element 1063 is not regarded as the color of the sub-pixel, the light filtering layer 828 may be disposed in the opening 82203 of the light blocking layer 822. In some embodiments, the light filtering layer 828 may further extend onto a part or all of the light blocking layer 822.

In some embodiments, spaces of the opening 82201, the opening 82202, and the opening 82203 that are not fully filled may further be filled with an encapsulation layer 830, and the encapsulation layer 830 may further cover the light blocking layer 822. The encapsulation layer 830 may for example include organic or inorganic encapsulating material which can block moisture and oxygen and/or have the characteristics of planarization layer for facilitating the following processes. Also, the encapsulation layer 830 may be an anti-reflection layer for anti-reflecting light from the outside environment. The display device 8 may further optionally include a cover layer 832 disposed on the encapsulation layer 830 and used for protecting the underlying layers.

In some embodiments, the display device 8 may further optionally include an auxiliary electrode 834 for reducing resistance difference between the second electrodes 116 of the light emitting element 1061, the light emitting element 1062, and the light emitting element 1063 and outer power source or peripheral circuit. For example, the auxiliary electrode 834 may be disposed between the second electrodes 116 and the protection layer 220 and located under the light blocking layer 822 and overlapped with the light blocking layer 822. The material of the auxiliary electrode 834 may for example include MgAg layer, nano silver glue or other suitable conductive material. In some embodiments, the auxiliary electrode 834 and the second electrodes 116 may include the same material, but not limited thereto. In some embodiments, the auxiliary electrode 834 may be disposed on the light blocking layer 822.

Figure 9:
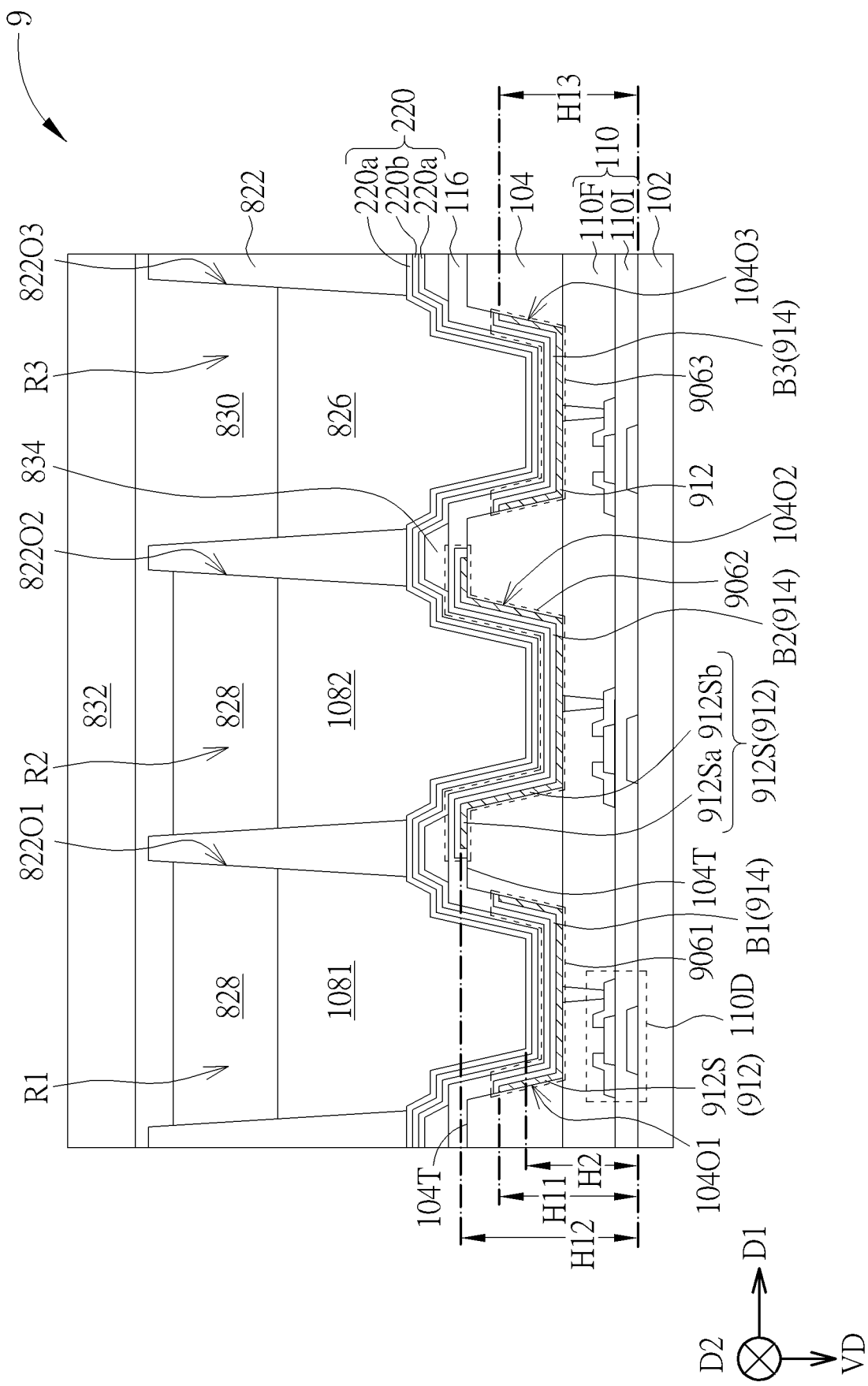
FIG. 9 schematically illustrates a cross-sectional view of a display device according to a ninth embodiment of the present disclosure.

FIG. 9 schematically illustrates a cross-sectional view of a display device according to a ninth embodiment of the present disclosure. As shown in FIG. 9, the difference between the display device 9 of the present embodiment and the eighth embodiment shown in FIG. 8 is that the height H11 and the height H12 of the side portions 912S of the first electrodes 912 of different light emitting element 9061 and light emitting element 9062 may not be the same. Specifically, the side portion 912S of the first electrode 912 of the light emitting element 9062 may extend to the top surface 104T of the first insulating layer 104, and therefore, may include apart 912Sa located on the top surface 104T of the first insulating layer 104 and another part 912Sb located on the side surface 104S of the first insulating layer 104. Also, the side portion 912S of the first electrode 912 of the light emitting element 9061 doesn't extend to the top surface 104T of the first insulating layer 104, so the height H12 of the side portion 912S of the first electrode 912 of the light emitting element 9062 may be greater than the height H11 of the side portion 912S of the first electrode 912 of the light emitting element 9061. For this reason, as the top view direction VD is taken as the symmetry axis, the first electrode 912 of the light emitting element 9061 and the first electrode 912 of the light emitting element 9062 are not symmetric to each other. In other words, through altering the sizes of the first electrodes 912 of different light emitting element 9061 and light emitting element 9062 may change the light emitting brightness of the light emitting element 9061 and the light emitting element 9062, thereby adjusting the white hue of the display device 9. In the present embodiment, the first electrode 912 of the light emitting element 9063 may have the same structure as the first electrode 912 of the light emitting element 9061, and therefore, the height H11 of the side portion 912S of the first electrode 912 of the light emitting element 9061 and the height H13 of the side portion 912S of the first electrode 912 of the light emitting element 9063 may be the same, but not limited thereto. In some embodiments, the height H11 of the side portion 912S of the first electrode 912 of the light emitting element 9061 and the height H13 of the side portion 912S of the first electrode 912 of the light emitting element 9063 may be different. In some embodiments, at least two of the first electrodes 912 of the light emitting element 9061, the light emitting element 9062, and the light emitting element 9063 may use the structures of the first electrodes 912 of the light emitting element 9061 and the light emitting element 9062. In some embodiments, at least apart of each of the side portions 912S of the first electrodes 912 of the light emitting element 9061, the light emitting element 9062, and the light emitting element 9063 may extend to the top surface 104T of the first insulating layer 104, and the first electrodes 912 of the light emitting element 9061, the light emitting element 9062, and the light emitting element 9063 may be electrically isolated.

In some embodiments, the light emitting layer 914 may be a discontinuous layer and include blocks (e.g. a block B1, a block B2, a block B3) separated from each other. In other words, the block B1 of the light emitting layer 914 of the light emitting element 9061, the block B2 of the light emitting layer 914 of the light emitting element 9062, and the block B3 of the light emitting layer 914 of the light emitting element 9063 may be disconnected from each other. In such situation, the block B1 of the light emitting layer 914 of the light emitting element 9061, the block B2 of the light emitting layer 914 of the light emitting element 9062, and the block B3 of the light emitting layer 914 of the light emitting element 9063 may for example be used for generating excitation light of different colors. In order to clearly illustrate the light emitting layer 914, the light emitting layer 914 of FIG. 9 take single layer as an example, but not limited thereto. In some embodiments, the light emitting layer 914 may be multilayer structure.

Figure 10:
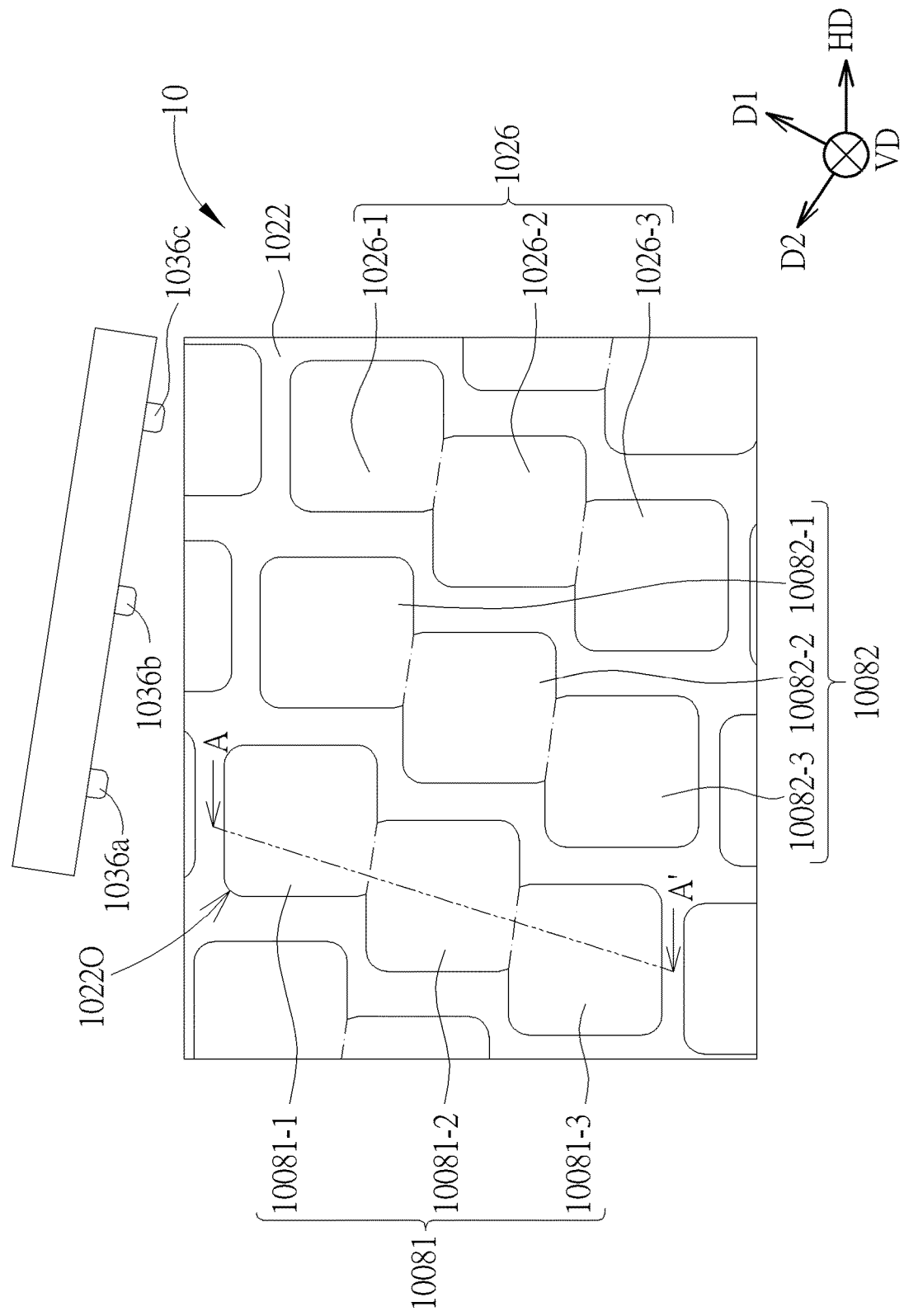
FIG. 10 schematically illustrates a top view of a display device according to a tenth embodiment of the present disclosure.
Figure 11:
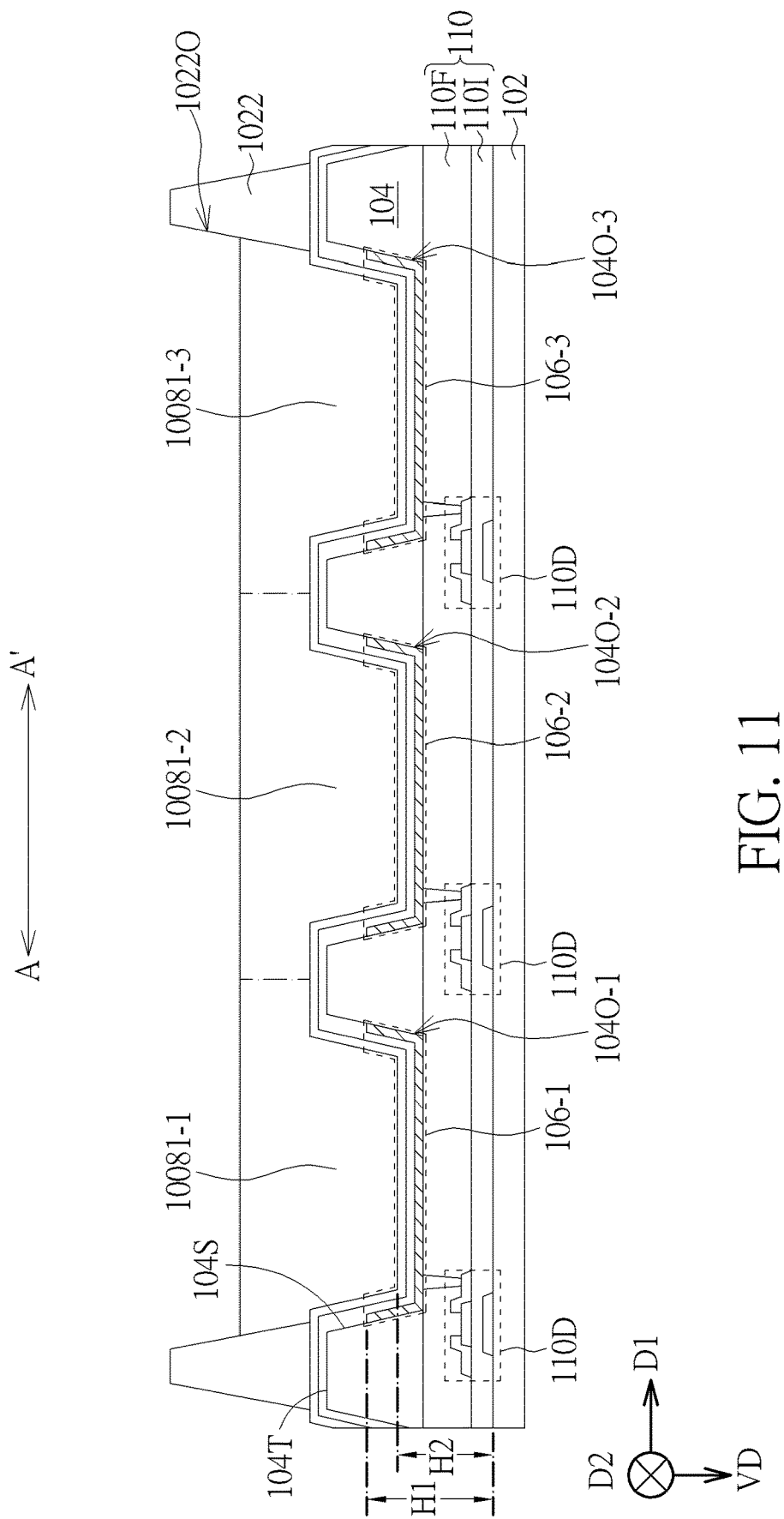
FIG. 11 schematically illustrates a cross-sectional view of FIG. 10 taken along a cross-sectional line A-A'.

FIG. 10 schematically illustrates a top view of a display device according to a tenth embodiment of the present disclosure, and FIG. 11 schematically illustrates a cross-sectional view of FIG. 10 taken along a cross-sectional line A-A'. As shown in FIG. 10 and FIG. 11, the difference between the display device 10 of the present embodiment and the eighth embodiment shown in FIG. 8 is that one light conversion element 10081 or one light scattering layer 1026 of the display device 10 may be disposed on plural light emitting elements 106. For example, the display device 10 may include a light conversion element 10081 and a light conversion element 10082 for generating converted light of different colors, and a light scattering layer 1026. The following description further takes the light conversion element 10081 corresponding to three light emitting elements (e.g. the light emitting element 106-1, the light emitting element 106-2, and the light emitting element 106-3) as an example, but not limited thereto. The light conversion element 10081 or the light scattering layer 1026 may correspond to plural light emitting elements. In the present embodiment, one opening 10220 of the light blocking layer 1022 may correspond to three openings of the first insulating layer 104 (e.g. the opening 1040-1, the opening 1040-2, and the opening 1040-3), the light emitting element 106-1, the light emitting element 106-2, and the light emitting element 106-3 are disposed corresponding to the opening 1040-1, the opening 1040-2, and the opening 1040-3 respectively, and the light conversion element 10081 fills up the opening 1040-1, the opening 1040-2 and the opening 1040-3. Accordingly, the filling of the light conversion element 10081 may be completed by performing a one-time injecting step or dripping step of inkjet process, thus reducing inkjet time.

In the present embodiment, each of the light emitting element 106-1, the light emitting element 106-2, and the light emitting element 106-3 is electrically connected to a corresponding driving element 110D respectively. Since the light conversion element 10081 is disposed in the same opening 10220 of the light blocking layer 1022, the light emitting element 106-1, the light emitting element 106-2, and the light emitting element 106-3 located in the same opening 10220 may correspond to the sub-pixels of the same color. The light conversion element 10081 may be divided into three portions (e.g. a portion 10081-1, a portion 10081-2, and a portion 10081-3) located on the light emitting element 106-1, the light emitting element 106-2, and the light emitting element 106-3 respectively, and therefore, the light emitting element 106-1, the light emitting element 106-2, and the light emitting element 106-3 may correspond to the sub-pixels of the same color. For example, the portion 10081-1, the portion 10081-2, and the portion 10081-3 of the light conversion element 10081 may be divided by the opening 1040-1, the opening 1040-2, and the opening 1040-3 of the first insulating layer 104. The virtual line located between any two of the portion 10081-1, the portion 10081-2, and the portion 10081-3 shown in FIG. 10 and FIG. 11 are for illustration but not intended to limit the boundary between any two of the portion 10081-1, the portion 10081-2, and the portion 10081-3. Similarly, the light conversion element 10082 may for example be divided into three portions (e.g. a portion 10082-1, a portion 10082-2, and a portion 10082-3) by the first insulating layer 104, and the portion 10082-1, the portion 10082-2, and the portion 10082-3 correspond to the sub-pixels of the same color. The light scattering layer 1026 for example be divided into three portions (e.g. a portion 1026-1, a portion 1026-2, and a portion 1026-3) by the first insulating layer 104, and the portion 1026-1, the portion 1026-2, and the portion 1026-3 correspond to the sub-pixels of the same color. Through disposing the opening 1040-1, the opening 1040-2, and the opening 1040-3 to be adjacent, the resolution of the display device 10 may be effectively increased.

It is noted that during the inkjet process, a nozzle 1036a, a nozzle 1036b, and a nozzle 1036c corresponding to different colors may be moved along a direction D2 different from the horizontal direction HD, so a distance between the light conversion element 10081 and the light conversion element 10082 of different colors in the horizontal direction HD, and distances between the light scattering layer 1026 and the light conversion element 10081 and between the light scattering layer 1026 and the light conversion element 10082 in the horizontal direction HD may be reduced. Accordingly, distances between different sub-pixels in the horizontal direction HD may be shrunk, and the resolution of the display device 10 is increased.

Figure 12:
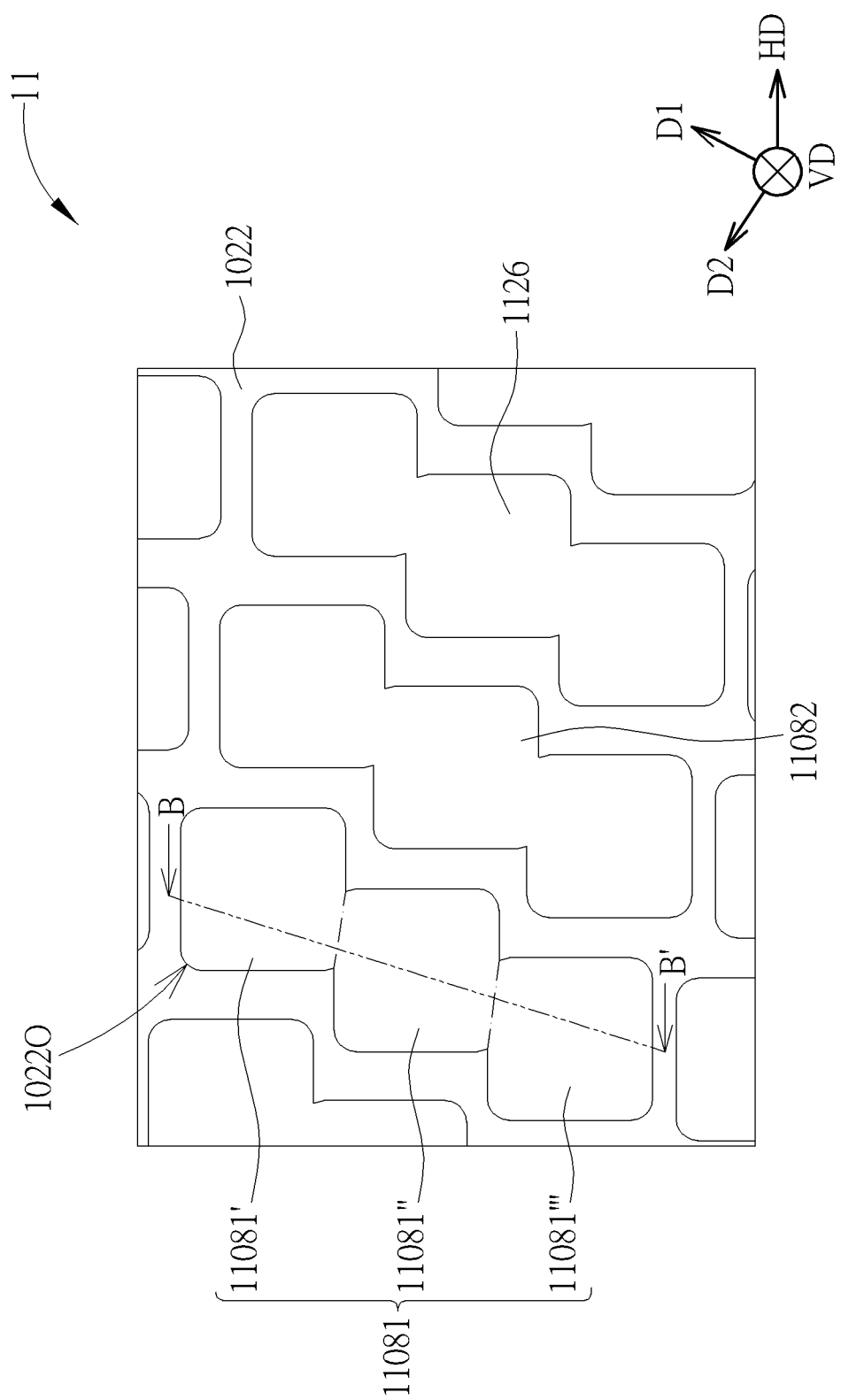
FIG. 12 schematically illustrates a top view of a display device according to an eleventh embodiment of the present disclosure.
Figure 13:
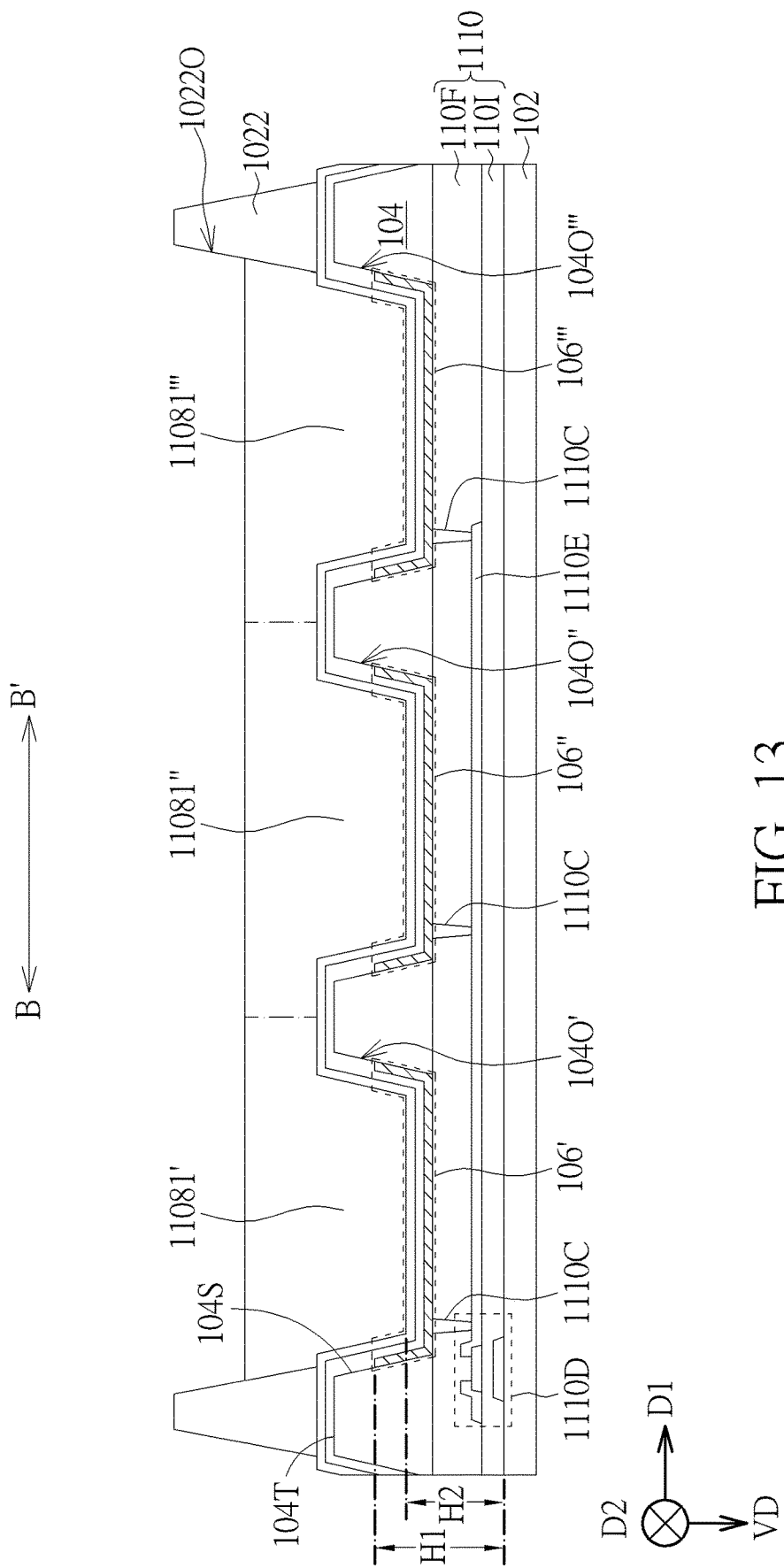
FIG. 13 schematically illustrates a cross-sectional view of FIG. 12 taken along a cross-sectional line B-B'.

FIG. 12 schematically illustrates a top view of a display device according to an eleventh embodiment of the present disclosure, and FIG. 13 schematically illustrates a cross-sectional view of FIG. 12 taken along a cross-sectional line B-B'. As shown in FIG. 12 and FIG. 13, the difference between the display device 11 of the present embodiment and the tenth embodiment shown in FIG. 11 is that plural light emitting elements (e.g. the light emitting element 106', the light emitting element 106", and the light emitting element 106''') of the display device 11 corresponding to the same light conversion element 11081 or the light scattering layer 1126 may be electrically connected to the same driving element 1110D. The light conversion element 11081 or the light scattering layer 1126 corresponding to three light emitting elements (the light emitting element 106', the light emitting element 106", and the light emitting element 106''') is taken for an example in the following description, but not limited thereto, and the light conversion element 11081 or the light scattering layer 1126 may correspond to plural light emitting elements 106. Specifically, the portion 11081', the portion 11081", and the portion 11081''' of the light conversion element 11081 may be disposed on the light emitting element 106', the light emitting element 106", and the light emitting element 106''' respectively, the thin film transistor layer 1110 may include a plurality of connecting holes 1110C, and through the connecting holes 1110C, the light emitting element 106', the light emitting element 106", and the light emitting element 106''' may be electrically connected to the electrode 1110E (source or drain) of the same driving element 1110D, such that the light emitting element 106', the light emitting element 106", and the light emitting element 106''' may correspond to the same sub-pixel. Because the light emitting element 106', the light emitting element 106", and the light emitting element 106''' are electrically connected to the same driving element 1110D, the light emitting element 106', the light emitting element 106", and the light emitting element 106''' can be driven by small current, thereby improving screen burn-in problem and increasing display quality and/or using lifetime. Similarly, at least one of the light conversion element 11082 and the light scattering layer 1126 may be disposed on the light emitting element 106', the light emitting element 106", and the light emitting element 106''' that are electrically connected to the same driving element 110D. For example, the three portions (the portion 11081', the portion 11081", and the portion 11081''') of the light conversion element 11081 may be divided by three openings (the opening 104', the opening 104", and the opening 104''') of the first insulating layer 104. The virtual line located between any two of the portion 11081', the portion 11081", and the portion 11081''' shown in FIG. 12 and FIG. 13 are for illustration but not intended to limit the boundary between any two of the portion 11081', the portion 11081", and the portion 11081'''.

Figure 14:
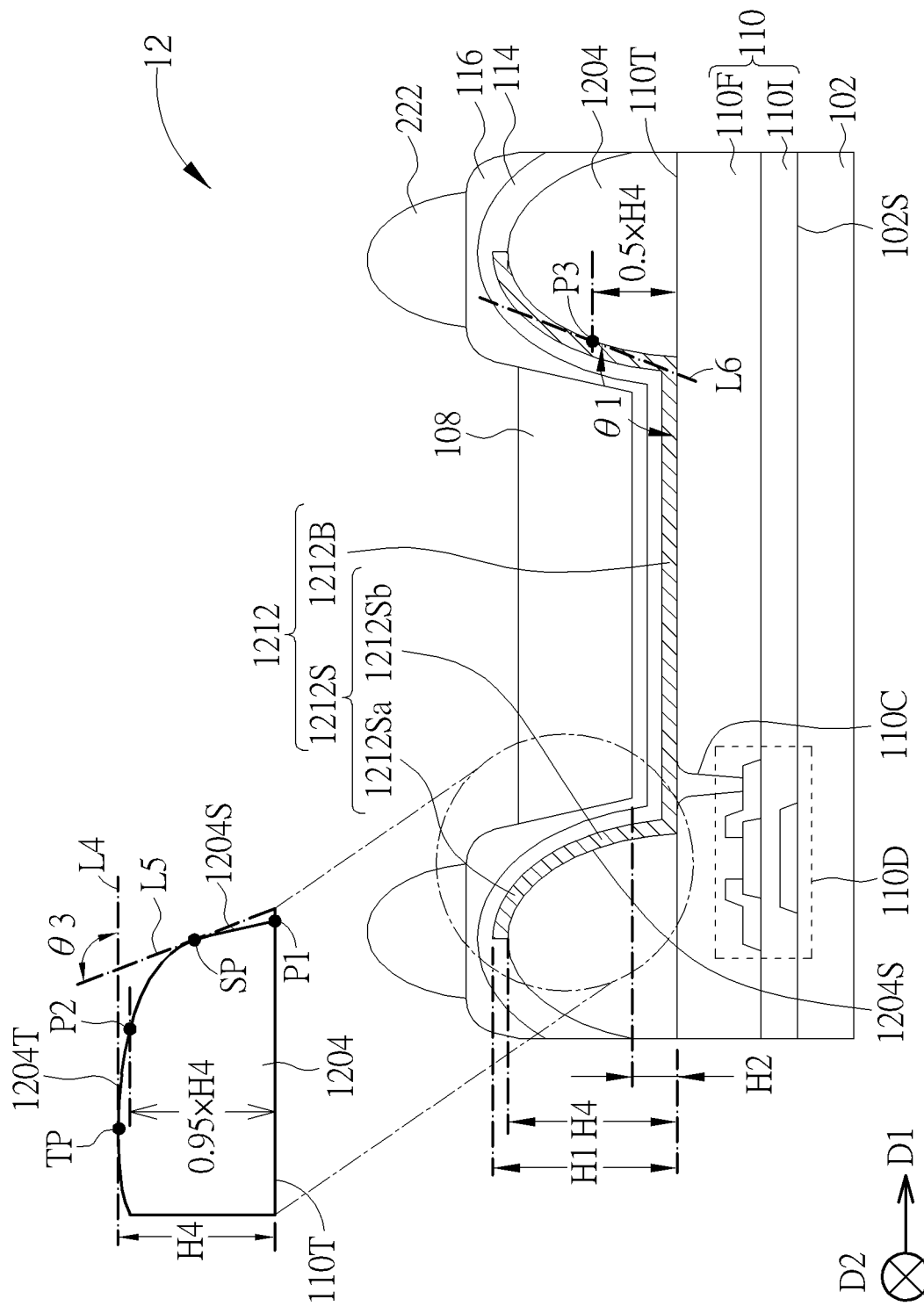
FIG. 14 schematically illustrates a cross-sectional view of a display device according to a twelfth embodiment of the present disclosure.

FIG. 14 schematically illustrates a cross-sectional view of a display device according to a twelfth embodiment of the present disclosure. As shown in FIG. 14, the first insulating layer 1204 of the display device 12 of the present embodiment has an arc-shaped surface. It is noted that for convenience, the "height" comparison of the present embodiment is relative to the top surface 110T of the thin film transistor layer 110 as an example, wherein when the substrate 102 is a flexible substrate, the comparison mentioned above is relative to the top surface 110T of the substrate 102 after the substrate 102 is spread to be flat, but not limited thereto. When the first insulating layer 1204 has an uneven surface (such as arc-shaped), the height H4 may for example be the height H4 of the top point TP of the first insulating layer 1204 or an average of plural points that are arbitrary taken from the top surface 1204T of the first insulating layer 1204 (e.g. taking 3 points), wherein the positions of the points may be taken without considering the part of the top surface 1204T close to the side surface 1204S. In some embodiments, when the first electrode 1212 is formed on the arc-shaped top surface 1204T of the first insulating layer 1204 to have an arc-shaped surface, the height H1 of the first electrode 1212 may be obtained by the method similar to the height H4. Also, when the first insulating layer 1204 has the arc-shaped surface, the top surface 1204T of the first insulating layer 1204 may be defined as the surface between the height H4 and the height H4 of 0.95 times, and the surface that is located under the height H4 of 0.95 times is defined as the side surface 1204S. The angle between the top surface 1204T and the side surface 1204S of the first insulating layer 1204 may be obtained according to the following described method. Firstly, a reference point P1 located at the bottom of the surface of the first insulating layer 1204 and a reference point P2 at which the surface of the first insulating layer 1204 is located at the height of 0.95 times are taken, and then, an intermediate point SP between the reference point P1 and the reference P2 and on the surface of the first insulating layer 1204 is obtained. Next, an angle θ3 between the top surface 1204T and the side surface 1204S of the first insulating layer 1204 may be defined as an angle between a tangent line L4 at the top point TP and a tangent line L5 at the intermediate point SP of the first insulating layer 1204. When the first electrode 1212 is formed on the arc-shaped top surface 1204T of the first insulating layer to have the arc-shaped surface, the top surface of the first electrode 1212 may be defined as the surface between the height H1 and the height H1 of 0.95 times, and the surface that is located under the height H1 of 0.95 times is defined as the side surface. An angle θ2 between a part 1212Sa of the side portion 1212S of the first electrode 1212 that extends to the top surface 1204T and another part 1212Sb of the side portion 1212S of the first electrode 1212 that doesn't extend to the top surface 1204T (as shown in FIG. 2) may be calculated by the angle θ3 of the first insulating layer 1204 or directly by the angle between the virtual line of the part 1212Sa (as the virtual line L2 shown in FIG. 2) and the virtual line of the part 1212Sb (as the virtual line L1 shown in FIG. 2) of the first electrode 1212. Furthermore, in the present disclosure, when the side portion 1212S of the first electrode 1212 extends to the top surface 1204T of the first insulating layer 1204, the top of the side portion 1212S of the first electrode 1212 may be defined as a point of the top surface of the side portion 1212S of the first electrode 1212 farthest from the layer on which the first electrode 1212 is disposed (such as the top surface 110T of the thin film transistor layer 110). When the side portion 1212S of the first electrode 1212 is just disposed on the side surface 1204S of the first insulating layer 1204 but doesn't extend to the top surface 1204T, the top of the side portion 1212S of the first electrode 1212 may be defined as a side of the side portion 1212S of the first electrode 1212 farthest from the layer on which the first electrode 1212 is disposed (such as the top surface 110T of the thin film transistor layer 110).

For example, the angle between the part 1212Sa and the part 1212Sb of the first electrode 1212 may refer to the method of the angle between the top surface 1204T and the side surface 1204S of the first insulating layer 1204, i.e. a reference point located at the bottom portion 1212B of the surface of the first electrode 1212 and a reference point at which the surface of the first electrode 1212 is located at the height of 0.95 times are taken, an intermediate point between two reference points and on the surface of the first electrode 1212 is then obtained, and the angle θ2 between the part 1212Sa and the part 1212Sb of the first electrode 1212 can be defined as the angle between a tangent line at the top point and a tangent line at the intermediate point of the first electrode 1212. The part 1212Sa of the first electrode 1212 may be defined as the part between the height H1 and the height H1 of 0.95 times, and the part located under the height H1 of 0.95 times is defined as the part 1212Sb.

Furthermore, since apart of the bottom of the light conversion element 108 close to the connecting hole 110C may sink, when the cross-sectional line crosses the connecting hole 110C, the height H2 of the bottom of the light conversion element 108 may not consider the height of the part close to the connecting hole 110C, and the height H2 may just consider the height of the relatively flat region far away from the connecting hole 110C.

Moreover, the side surface 1204S of the first insulating layer 1204 may be an uneven surface. In the present embodiment, the first electrode 1212 formed on the arc-shaped side surface 1204S of the first insulating layer 1204 may have arc-shaped side portion 1212S. In such situation, the finding method of the angle θ1 between the side portion 1212S and the bottom portion 1212B of the first electrode 1212 may be mentioned in the following description. Firstly, a reference point P3 at which the side surface 1204S of the first insulating layer 1204 is located at the height H1 of 0.5 times is obtained. Then, the angle θ1 between the side portion 1212S and the bottom portion 1212B of the first electrode 1212 may be defined as the angle between a tangent line L6 of the side surface 1204S of the first insulating layer 1204 at the reference P3 and the top surface 110T of the thin film transistor layer 110.

In some embodiments, the technical features in the embodiments mentioned above may be arbitrarily mixed, combined or used when this combination doesn't depart from the spirit of the present disclosure or the technical features don't conflict to each other.

The display device provided by the present disclosure has the uneven first electrode, so the light emitting element may be uneven, thereby increasing the light emitting area. Accordingly, the excitation light generated by the light emitting element corresponding to the side portion of the first electrode may emit into the side surface of the light conversion element, such that the light conversion particles in the light conversion element may be fully used, thereby increasing the converting efficiency of the light conversion element. The uneven first electrode may reduce loss and leakage of the converted light generated by the light conversion element due to being emitted out from the side surface of the first insulating layer or may increase the utility of the converted light of the light conversion element, so the luminous efficiency of the display device can be improved.

Those skilled in the art will readily observe that numerous modifications and alterations of the device and method may be made while retaining the teachings of the disclosure.

Accordingly, the above disclosure should be construed as limited only by the metes and bounds of the appended claims.

What is claimed is:

1. A display device, comprising:
a substrate;
a transistor disposed on the substrate;
an insulating layer disposed on the substrate, wherein the insulating layer comprises at least one opening;
a light blocking layer disposed on a top surface of the insulating layer and at least partially overlapped with the transistor;
a first light emitting element disposed in the at least one opening, wherein the first light emitting element comprises an electrode electrically connected to the transistor; and
a light conversion element disposed on the first light emitting element,
wherein the electrode is disposed between the substrate and the light blocking layer, and the light blocking layer is overlapped with the electrode.

2. The display device of claim 1, wherein a top surface of the light conversion element is concave.

3. The display device of claim 1, wherein a top surface of the light conversion element is convex.

4. The display device of claim 1, further comprising a light scattering layer, wherein the light scattering layer comprises a plurality of scattering particles and corresponds to the first light emitting element.

5. The display device of claim 1, further comprising a second light emitting element adjacent to the first light emitting element, wherein the first light emitting element and the second light emitting element are electrically connected to an electrode of the transistor.

6. The display device of claim 1, further comprising an auxiliary electrode disposed between the insulating layer and the light blocking layer.

7. The display device of claim 1, wherein a height of a top surface of the light blocking layer is greater than a height of a top surface of the light conversion element.

8. A display device, comprising:
a substrate;
a transistor disposed on the substrate;
an insulating layer disposed on the substrate, wherein the insulating layer comprises at least one opening;
a light blocking layer disposed on a top surface of the insulating layer and at least partially overlapped with the transistor;
a light emitting element disposed in the at least one opening, wherein the light emitting element comprises an electrode electrically connected to the transistor; and
a color filter layer disposed on the light emitting element,
wherein the electrode is disposed between the substrate and the light blocking layer, and the light blocking layer is overlapped with the electrode.

9. The display device of claim 8, further comprising a light scattering layer disposed on the light emitting element, wherein the light scattering layer comprises a plurality of scattering particles and corresponds to the light emitting element.

10. The display device of claim 8, further comprising an auxiliary electrode disposed between the insulating layer and the light blocking layer.

11. The display device of claim 10, further comprising a protection layer disposed between the auxiliary electrode and the light blocking layer.

12. The display device of claim 8, further comprising a light conversion element disposed between the light emitting element and the color filter layer.

13. The display device of claim 8, wherein a height of a top surface of the light blocking layer is greater than a height of a top surface of the color filter layer.

14. The display device of claim 8, further comprising a planarization layer disposed between the transistor and the insulating layer, wherein the at least one opening and the planarization layer form a recess, and in a top view direction of the display device, an area of the electrode of the light emitting element is greater than an area of a bottom of the recess.

* * * * *